(12) United States Patent
Kawai

(10) Patent No.: US 11,024,751 B2
(45) Date of Patent: Jun. 1, 2021

(54) PHOTOELECTRIC CONVERSION ELEMENT. PHOTOELECTRIC CONVERSION MODULE, AND ELECTRONIC DEVICE

(71) Applicant: SEIKO EPSON CORPORATION, Tokyo (JP)

(72) Inventor: Hiromu Kawai, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 134 days.

(21) Appl. No.: 16/283,344

(22) Filed: Feb. 22, 2019

(65) Prior Publication Data
US 2019/0267497 A1    Aug. 29, 2019

(30) Foreign Application Priority Data

Feb. 23, 2018  (JP) .............................. JP2018-030522

(51) Int. Cl.
| | |
|---|---|
| H01L 31/02 | (2006.01) |
| H01L 31/0236 | (2006.01) |
| G04G 19/00 | (2006.01) |
| H01L 31/05 | (2014.01) |
| H01L 31/053 | (2014.01) |
| H01L 31/0352 | (2006.01) |
| G04G 17/06 | (2006.01) |
| G04C 10/02 | (2006.01) |

(52) U.S. Cl.
CPC ........ *H01L 31/02008* (2013.01); *G04C 10/02* (2013.01); *G04G 17/06* (2013.01); *G04G 19/00* (2013.01); *H01L 31/02363* (2013.01); *H01L 31/035281* (2013.01); *H01L 31/053* (2014.12); *H01L 31/0516* (2013.01)

(58) Field of Classification Search
CPC ......... H01L 31/02008; H01L 31/02363; H01L 31/035281; H01L 31/0516; H01L 31/053; H01L 31/0682; G04C 10/02; G04G 19/00; G04G 19/02; G04G 17/06
See application file for complete search history.

(56) References Cited

U.S. PATENT DOCUMENTS 6,268,558 B1 * 7/2001 Kubota ................. B32B 27/306
136/244
2007/0261731 A1   11/2007 Abe et al.
(Continued)

FOREIGN PATENT DOCUMENTS

JP    2006-073985 A    3/2006
JP    2011-258996 A    12/2011
(Continued)

*Primary Examiner* — Mayla Gonzalez Ramos
(74) *Attorney, Agent, or Firm* — Oliff PLC

(57) ABSTRACT

A photoelectric conversion element includes a semiconductor substrate which has a substrate outer edge including a circular arc, and a first terminal, a second terminal, a third terminal, and a fourth terminal disposed in this order along a circumferential direction of the circular arc on one surface side of the semiconductor substrate, and in which each of a distance from the substrate outer edge to the second terminal and a distance from the substrate outer edge to the fourth terminal is greater than both a distance from the substrate outer edge to the first terminal and a distance from the substrate outer edge to the third terminal.

16 Claims, 10 Drawing Sheets

(56) References Cited

U.S. PATENT DOCUMENTS

| | | |
|---|---|---|
| 2011/0094562 A1 | 4/2011 | Funakoshi |
| 2012/0192915 A1 | 8/2012 | Alali et al. |
| 2015/0268636 A1 | 9/2015 | Sawada |
| 2016/0204292 A1* | 7/2016 | Saito .................... H01L 31/042 |
| | | 368/205 |

FOREIGN PATENT DOCUMENTS

| JP | 2013-507762 A | 3/2013 |
|---|---|---|
| JP | 2014-011232 A | 1/2014 |
| JP | 2015-154050 A | 8/2015 |
| JP | 2016-176957 A | 10/2016 |
| JP | 2016-226101 A | 12/2016 |

\* cited by examiner

PHOTOELECTRIC CONVERSION ELEMENT. PHOTOELECTRIC CONVERSION MODULE, AND ELECTRONIC DEVICE

BACKGROUND

1. Technical Field

The present invention relates to a photoelectric conversion element, a photoelectric conversion module, and an electronic device.

2. Related Art

A wearable electronic device (wristwatch) that receives radio waves from a position information satellite used in a positioning system such as a global positioning system (GPS) and acquires a time included in a positioning signal or measures a current position has been proposed.

For example, JP-A-2016-176957 discloses a wristwatch which includes a wristwatch case, a dial plate, a timepiece module disposed on the lower side of the dial plate and including an antenna for receiving radio waves from the position information satellite, and a solar panel provided between the dial plate and the timepiece module. According to such a wristwatch, since the dial plate has light transparency, it is possible to generate power necessary for an operation of the timepiece module by irradiating the solar panel with external light transmitted through the dial plate.

On the other hand, ultrahigh frequency waves are used for radio waves transmitted from the positioning information satellite, but in order to receive the ultrahigh frequency waves, it is necessary to operate a high frequency circuit. For that reason, there is a problem that power consumption of the wristwatch increases.

In particular, in recent years, it is required to install a function (data logger) of recording a moving route by frequently performing an operation of measuring the current position. When such a function is installed, since the operation time of the high frequency circuit also becomes long, there is concern that the power consumption will further increase. Then, the power consumption exceeds power generated by the solar panel, so that it is inevitable to separately prepare a component for charging a secondary battery from an external power supply, or it becomes necessary to increase a capacity of the secondary battery. As a result, miniaturization and weight reduction of the wristwatch are hindered.

On the other hand, in the wristwatch described in JP-A-2016-176957, an amount of light decreases when external light is transmitted through the dial plate. For that reason, there is a problem that sufficient power cannot be generated in the solar panel. Also, in a case of enlarging the solar panel in size to secure power, there is a problem that a size of a main part such as the timepiece module is restricted or a size of the wristwatch is enlarged.

Therefore, a solar cell that can be applied to an electronic device having a circular mounting space such as a wristwatch by making an outer shape into a circular arc shape has been studied.

JP-A-2006-073985 discloses a solar power generation module in which a shape of a disk-shaped single crystal wafer is utilized and arcuate cells divided from the disk-shaped single crystal wafer are arranged. With this configuration, it is possible to easily manufacture the solar cell of which a part of outer shape is in a circular arc shape.

On the other hand, in JP-A-2006-073985, a metal wiring (tab line) is used for electrical connection to the solar cell. However, connection by the metal wiring has a problem that its work difficulty level becomes high especially in a case where the size of the solar cell is small.

JP-A-2011-258996 discloses a solar battery module which includes a back surface electrode type solar cell, a wiring substrate having a wiring pattern formed on a film-like resin base material and in which solder or a conductive adhesive is used for connection between the electrode on the solar cell side and the wiring substrate.

Further, JP-A-2014-011232 discloses a solar cell element which includes a solar cell having an electrode on the back surface and a wiring member and in which the electrode of the solar cell and the wiring member are electrically connected by a connection structure which includes a metal portion containing metal having a melting point of 200° C. or less and a resin portion containing thermosetting resin.

According to such a structure, since the electrode and the wiring substrate can be connected at once by heat treatment such as solder reflow treatment, there is an advantage that work efficiency is high.

However, in a case where a cell including a curved line at its outer edge like an arcuate cell as described above is joined to a substrate, it is necessary to consider disposition of terminals serving as joining portions. That is, in a solar cell having an outer edge including a curved line, there is a concern that troubles such as cracking due to vibration may be caused depending on the disposition of the terminals. In other words, such a solar cell tends to undergo large deformation such as deflection locally when vibration or impact is applied. When such deformation occurs, defects such as cracking may occur in the solar cell.

SUMMARY

An advantage of some aspects of the invention is to provide a photoelectric conversion element capable of suppressing defects such as cracking due to vibration, and a highly reliable photoelectric conversion module and electronic device including the photoelectric conversion element.

The advantage can be achieved by the following configurations.

A photoelectric conversion element according to an aspect of the invention includes a semiconductor substrate which has a substrate outer edge including a circular arc and a first terminal, a second terminal, a third terminal, and a fourth terminal disposed in this order along a circumferential direction of the circular arc on one surface side of the semiconductor substrate, and in which each of a distance from the substrate outer edge to the second terminal and a distance from the substrate outer edge to the fourth terminal is greater than both a distance from the substrate outer edge to the first terminal and a distance from the substrate outer edge to the third terminal.

With this configuration, since vibration characteristics are improved, a photoelectric conversion element capable of suppressing defects such as cracking can be obtained.

In the photoelectric conversion device according to the aspect of the invention, it is preferable that the semiconductor substrate has the substrate outer edge and a substrate inner edge positioned inside the substrate outer edge and including a curved line, the first terminal and the third terminal are positioned close to a substrate outer edge side from an intermediate line between the substrate outer edge and the substrate inner edge, and the second terminal and the fourth terminal are positioned close to a substrate inner edge side from the intermediate line.

With this configuration, in the photoelectric conversion element, the terminals can be relatively evenly disposed without being biased. As a result, support points for supporting the photoelectric conversion element are also evenly dispersed, and particularly in a module mounted with a photoelectric conversion element of a Si substrate or the like, in which crystals occupy the majority and the mechanical characteristics are likely to be relatively uniform, it is possible to suppress natural vibration to a short period and to obtain favorable vibration characteristics. In addition, it is possible to suppress occurrence of defects due to stress concentrating locally.

In the photoelectric conversion element according to the aspect of the invention, it is preferable that five or more terminals including the first terminal, the second terminal, the third terminal, and the fourth terminal are further included, and the number of the terminals positioned close to the substrate outer edge side from the intermediate line is greater than the number of the terminals positioned close to the substrate inner edge side from the intermediate line.

With this configuration, it is possible to reduce the difference between a distance between the terminals on the substrate outer edge side and a distance between the terminals on the substrate inner edge side. As a result, variations in the distance between the support points supporting the photoelectric conversion element are suppressed, and deformation due to vibration and concentration of thermal stress are less likely to occur.

In the photoelectric conversion element according to the aspect of the invention, it is preferable that the substrate outer edge and the substrate inner edge each include a circular arc, the circular arcs being concentric with each other.

With this configuration, design for the photoelectric conversion element is facilitated and balance of a structure is optimized in the photoelectric conversion element.

In the photoelectric conversion element according to the aspect of the invention, it is preferable that the semiconductor substrate has single crystallinity.

With this configuration, a photoelectric conversion element having particularly high photoelectric conversion efficiency can be obtained. By saving the space of the photoelectric conversion element, designability of an electronic device can be further enhanced. Furthermore, a photoelectric conversion element, in which the photoelectric conversion efficiency is unlikely to be lowered even in low illuminance light such as indoor light, can be obtained.

A photoelectric conversion module according to another aspect of the invention includes the photoelectric conversion element according to the aspect of the invention and a wiring substrate provided so as to overlap the photoelectric conversion element.

With this configuration, a highly reliable photoelectric conversion module can be obtained.

In the photoelectric conversion module according to the aspect of the invention, it is preferable that the wiring substrate includes an insulating substrate, a conductive layer provided on the insulating substrate, and a plurality of land portions electrically connected to the conductive layer, and disposition of the land portions corresponds to disposition of the first terminal, the third terminal, the second terminal, and the fourth terminal.

With this configuration, after the photoelectric conversion element and the wiring substrate are joined to each other, extra exposed portions of the terminals or the land portions are reduced. As a result, the risk of electrical failure such as short-circuiting due to unintentional contact during mounting can be suppressed, and reliability of the photoelectric conversion module can be further enhanced.

An electronic device according to another aspect of the invention includes the photoelectric conversion element according to the aspect of the invention.

With this configuration, a highly reliable electronic device can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a photoelectric conversion element, a photoelectric conversion module, and an electronic device according to the invention will be described in detail based on preferred embodiments illustrated in the accompanying drawings.

Electronic Device

First, an electronic timepiece to which an embodiment of an electronic device according to the invention is applied will be described. The electronic timepiece has a configuration in which when a light receiving surface of the electronic timepiece is irradiated with light, the electronic timepiece generates power (photoelectric conversion) by a built-in solar cell (photoelectric conversion module) and utilizes the power obtained by power generation as drive power.

Figure 1:
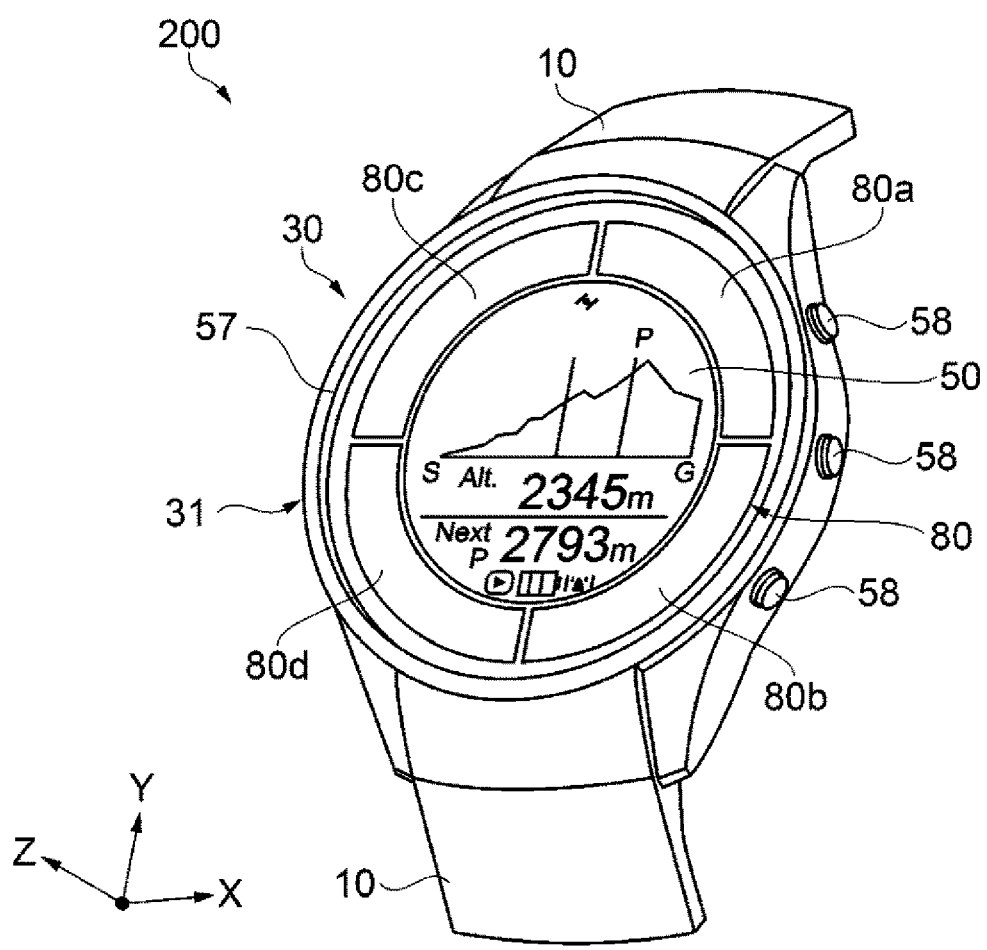
FIG. 1 is a perspective view illustrating an electronic timepiece to which an embodiment of an electronic device according to the invention is applied.
Figure 2:
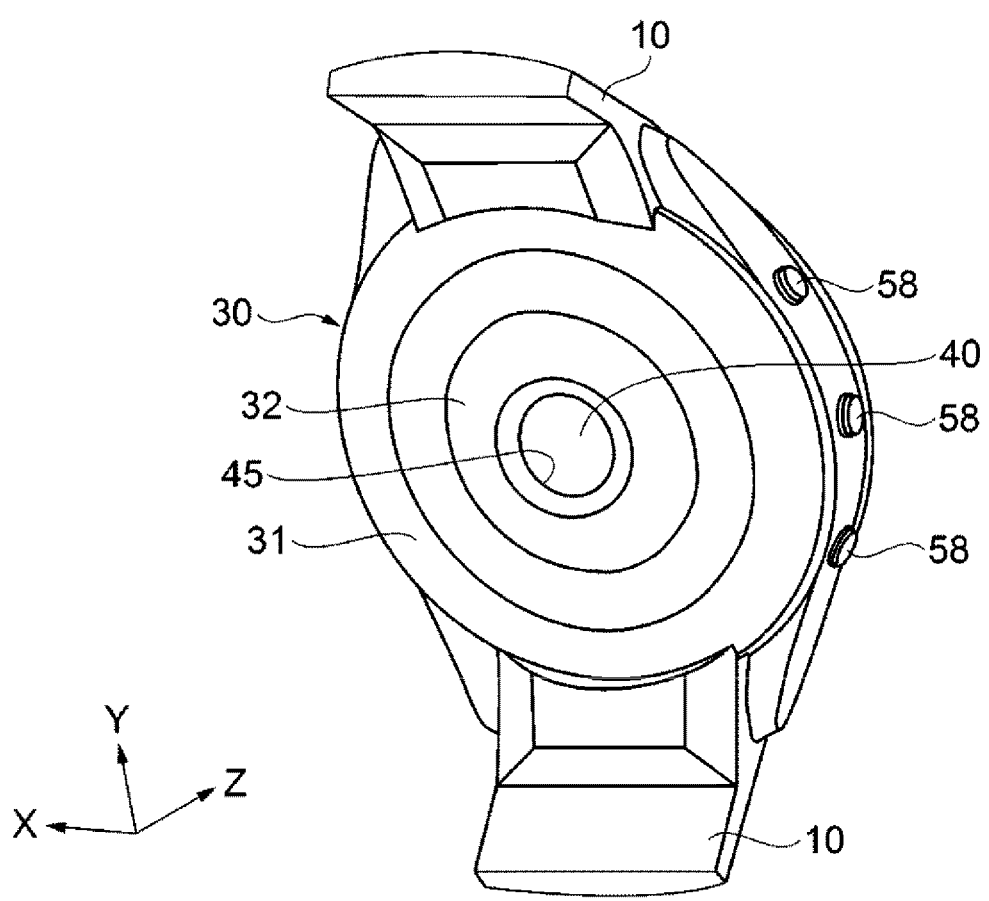
FIG. 2 is another perspective view illustrating the electronic timepiece to which the embodiment of the electronic device according to the invention is applied.
Figure 3:
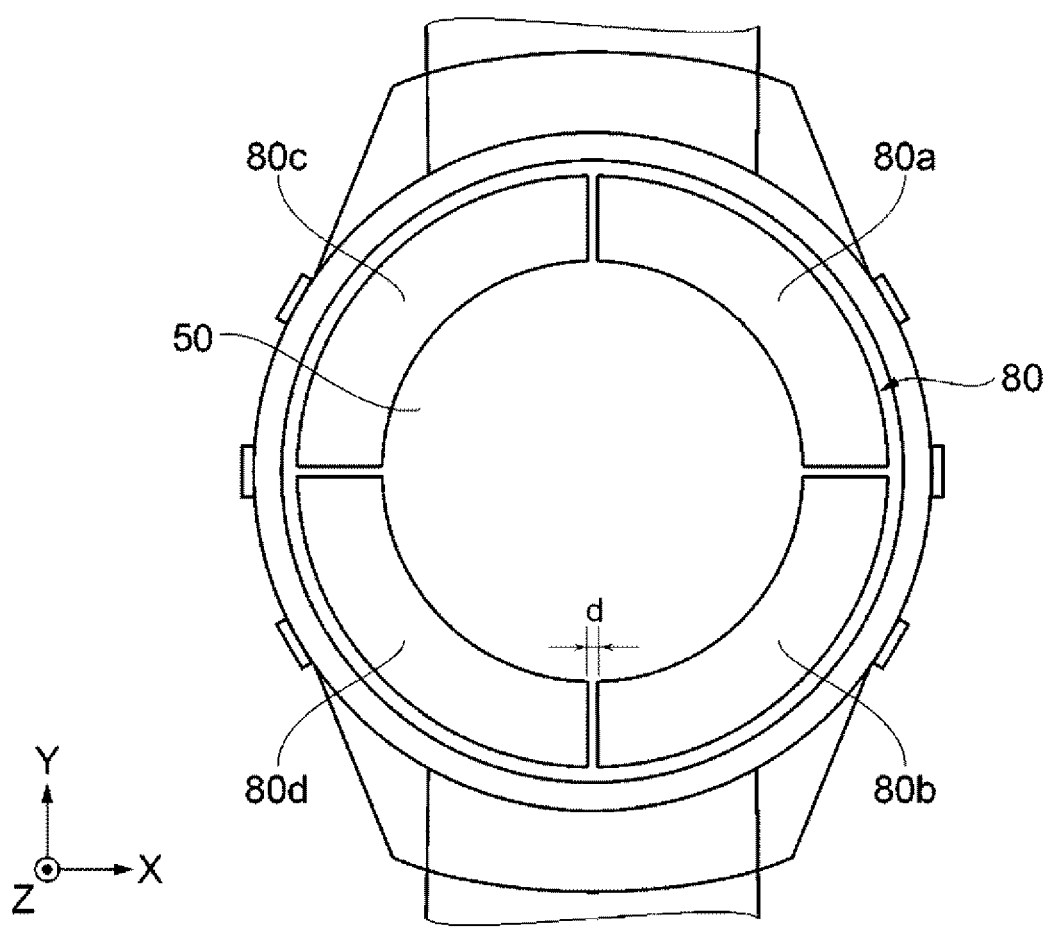
FIG. 3 is a plan view of the electronic timepiece illustrated in FIGS. 1 and 2.
Figure 4:
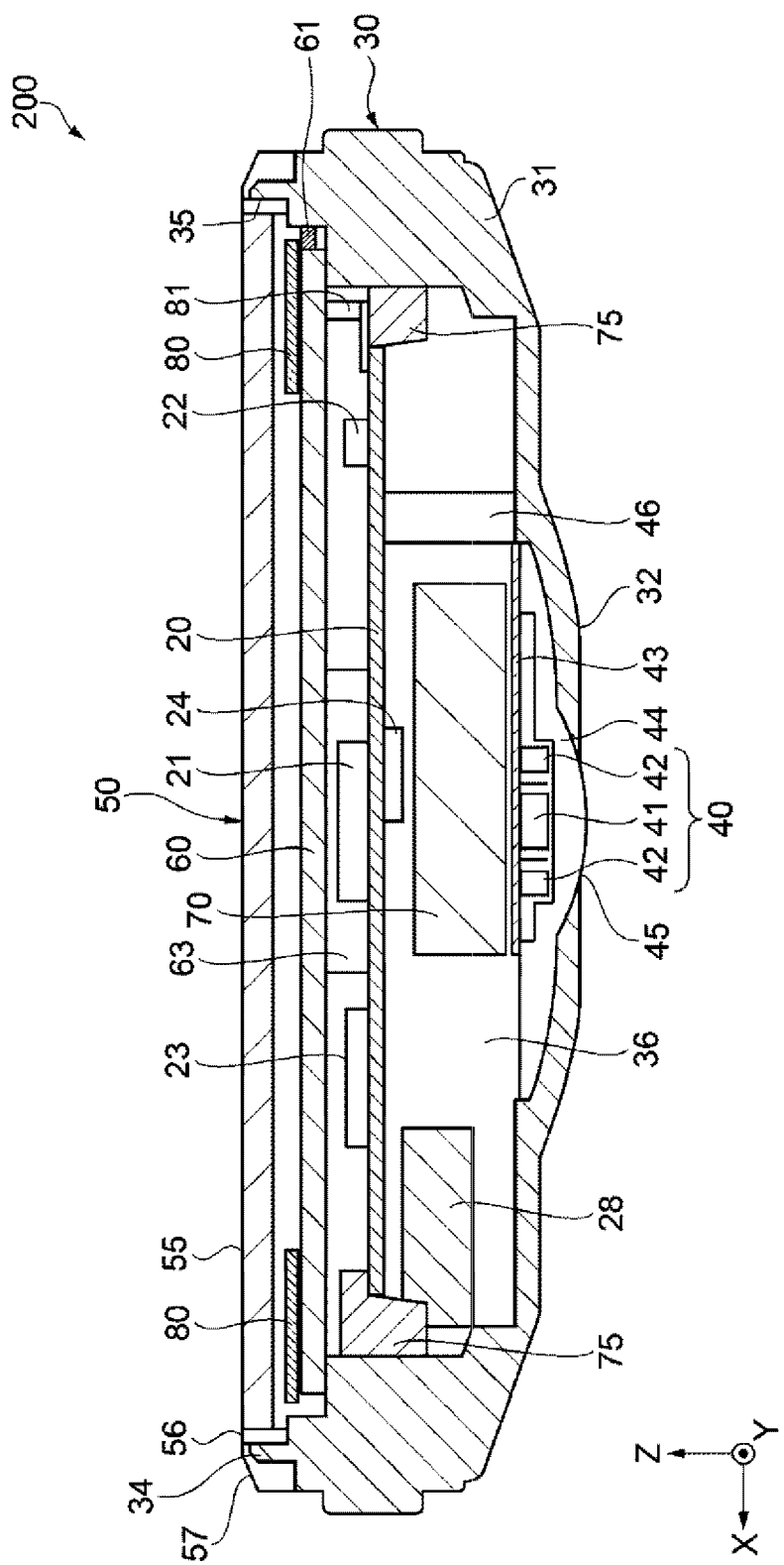
FIG. 4 is a longitudinal cross-sectional view of the electronic timepiece illustrated in FIGS. 1 and 2.

FIGS. 1 and 2 are perspective views each illustrating an electronic timepiece to which an embodiment of an electronic device according to the invention is applied. FIG. 1 is a perspective view illustrating an external appearance of the electronic timepiece when viewed from the front side (light receiving surface side), and FIG. 2 is a perspective view illustrating the external appearance when viewed from the back side of the electronic timepiece. FIG. 3 is a plan view of the electronic timepiece illustrated in FIGS. 1 and 2, and FIG. 4 is a longitudinal cross-sectional view of the electronic timepiece illustrated in FIGS. 1 and 2.

An electronic timepiece 200 includes a device main body 30 including a case 31, a solar cell 80 (photoelectric conversion module), a display unit 50, and an optical sensor portion 40, and two bands 10 attached to the case 31.

In the following description, a direction axis extending in a direction orthogonal to the light receiving surface of the solar cell 80 is defined as the Z-axis. The direction from the back side to the front side of the electronic timepiece is defined as the "+Z-direction", and the opposite direction is defined as the "−Z-direction".

On the other hand, two axes orthogonal to the Z-axis are defined as the "X-axis" and the "Y-axis". Among the two axes, the direction axis connecting the two bands 10 is defined as Y-axis, and the direction axis orthogonal to the Y-axis is defined as the X-axis. The upward direction of the display unit 50 is defined as the "+Y-direction", and the downward direction thereof is defined as "−Y-direction". Further, when the light receiving surface of the solar cell 80 is viewed in a plan view, the rightward direction is defined as the "+X-direction" and the leftward direction is defined as the "−X-direction".

Hereinafter, a configuration of the electronic timepiece 200 will be sequentially described.

Device Main Body

The device main body 30 includes a casing provided with the case 31 which is opened on the front side and the back side, a windshield plate 55 provided so as to close an opening on the front side, a bezel 57 provided so as to cover a surface of the case 31 and the side surface of the windshield 55, and a transparent cover 44 provided so as to close an opening on the back side. In the casing, various constituent elements which will be described later are accommodated.

In the casing, the case 31 has an annular shape, an opening 35 into which the windshield plate 55 can be fitted is provided on the front side of casing, and an opening (measurement window portion 45) into which a transparent cover 44 can be fitted is provided on the back side thereof.

A part of the back side of the case 31 is a protruded portion 32 formed so as to protrude. A top portion of the protruded portion 32 is open, the transparent cover 44 is fitted in the opening, and a part of the transparent cover 44 protrudes from the opening.

As the constituent material of the case 31, a resin material, a ceramic material and the like, in addition to, for example, a metal material such as stainless steel and a titanium alloy, may be included. The case 31 may be an assembly of a plurality of parts, in this case the parts may be different from each other.

A plurality of operation units 58 (operation buttons) are provided on the outer surface of the case 31.

Further, on the outer edge of the opening 35 provided on the front side of the case 31, a projection portion 34 protruding in the +Z-direction is formed. An annular bezel 57 is provided so as to cover the projection portion 34.

Furthermore, a windshield plate 55 is provided inside the bezel 57. A side surface of the windshield plate 55 and the bezel 57 are adhered through a joining member 56 such as a packing or adhesive.

As the constituent material of the windshield plate 55 and the transparent cover 44, for example, a glass material, a ceramic material, a resin material, and the like may be included. The windshield plate 55 has translucency so that the display content of the display unit 50 can be visually recognized through the windshield plate 55. Furthermore, the transparent cover 44 also has translucency, and can cause the optical sensor unit 40 to function as a biological information measurement unit.

An internal space 36 of the casing is a closed space that can accommodate various constituent elements which will be described later.

The device main body 30 includes a circuit substrate 20, an azimuth sensor 22 (geomagnetism sensor), an acceleration sensor 23, a GPS antenna 28, an optical sensor unit 40, an electro-optical panel 60 and an illumination unit 61 constituting the display unit 50, a secondary battery 70, and a solar cell 80, as elements accommodated in the internal space 36. In addition to these elements, the device main body 30 may include a pressure sensor for calculating an altitude, a water depth and the like, a temperature sensor for measuring a temperature, various sensors such as an angular velocity sensor, a vibrator, and the like.

A circuit substrate 20 is a substrate including wirings for electrically connecting the elements described above. Further, on the circuit substrate 20, a central processing unit (CPU) 21 including a control circuit, a drive circuit, and the like for controlling the operation of the elements described above and other circuit elements 24 are mounted.

The solar cell 80, the electro-optical panel 60, the circuit substrate 20, and the optical sensor unit 40 are disposed in this order from the windshield plate 55 side. With this configuration, the solar cell 80 is disposed close to the windshield plate 55, and many external light beams are efficiently incident on the solar cell 80. As a result, the power generation efficiency of the solar cell 80 can be maximized.

Hereinafter, elements accommodated in the device main body 30 will be described in further detail.

An end portion of the circuit substrate 20 is attached to the case 31 through a circuit case 75.

A connection wiring portion 63 and a connection wiring portion 81 are electrically connected to the circuit substrate 20. Among the constituents, the circuit substrate 20 and the electro-optical panel 60 are electrically connected through the connection wiring portion 63. The circuit substrate 20 and the solar cell 80 are electrically connected through the connection wiring portion 81. These connection wiring portions 63 and 81 are constituted with, for example, flexible circuit substrates and are efficiently routed to gaps of the internal space 36.

The azimuth sensor 22 and the acceleration sensor 23 can detect information on body movement of a user wearing the electronic timepiece 200. The azimuth sensor 22 and the acceleration sensor 23 output signals that change according to the body movement of the user, and transmit the signals to the CPU 21.

The CPU 21 includes a circuit for controlling a GPS reception unit (not illustrated) including a GPS antenna 28, a circuit for driving the optical sensor unit 40 to measure a pulse wave or the like of the user, a circuit for driving the display unit 50, a circuit for controlling power generation of the solar cell 80, and the like.

The GPS antenna 28 receives radio waves from a plurality of positioning information satellites. The device main body 30 includes a signal processing unit (not illustrated). The signal processing unit performs positioning calculation based on a plurality of positioning signals received by the GPS antenna 28 and acquires time and position information. The signal processing unit transmits these pieces of information to the CPU 21.

The optical sensor unit 40 is a biological information measuring unit that detects a pulse wave or the like of a user. The optical sensor unit 40 illustrated in FIG. 4 is a photoelectric sensor including a light receiving unit 41, a plurality of light emitting units 42 provided outside the light receiving unit 41, and a sensor substrate 43 on which the light receiving unit 41 and the light emitting unit 42 are provided. The light receiving unit 41 and the light emitting unit 42 face a measurement window unit 45 of the case 31 through the transparent cover 44 described above. In addition, the circuit substrate 20 and the optical sensor unit 40 are electrically connected through a connection wiring portion 46 included in the device main body 30.

In such an optical sensor unit 40, a subject (for example, a skin of the user) is irradiated with light emitted from the light emitting unit 42 and reflected light is received by the light receiving unit 41, thereby detecting a pulse wave. The optical sensor unit 40 transmits information of the detected pulse wave to the CPU 21.

Instead of the photoelectric sensor, another sensor such as an electrocardiograph or an ultrasonic sensor may be used.

In addition, the device main body 30 includes a communication unit (not illustrated). The communication unit transmits various kinds of information acquired by or stored in the device main body 30, the calculation result by the CPU 21, and the like to the outside.

The display unit 50 allows the user to visually confirm the display content of the electro-optical panel 60 through the windshield plate 55. With this configuration, for example, information acquired from elements described above can be displayed on the display unit 50 as characters or images, and the user can recognize the information.

Examples of the electro-optical panel 60 include a liquid crystal display element, an organic electroluminescence (EL) display element, an electrophoretic display element, a light emitting diode (LED) display element, and the like.

In FIG. 4, as an example, a case where the electro-optical panel 60 is a reflective display element (for example, a reflective liquid crystal display element and an electrophoretic display element) is illustrated. For that reason, the display unit 50 includes an illumination unit 61 provided on a light incident surface of a light guide plate (not illustrated) included in the electro-optical panel 60. As the illumination unit 61, for example, an LED element may be included. The illumination unit 61 and the light guide plate function as a front light of the reflective display device.

In the case where the electro-optical panel 60 is a transmissive display element (for example, a transmissive liquid crystal display element or the like), a back light may be provided instead of the front light.

In the case where the electro-optical panel 60 is a self-emitting type display element (for example, an organic EL display element, an LED display element or the like), or in a case where the electro-optical panel 60 is a display element which is not a self-emitting type but uses external light, the front light and the back light can be omitted.

The secondary battery 70 is connected to the circuit substrate 20 through a wiring (not illustrated). With this configuration, the power output from the secondary battery 70 can be used for driving the elements described above. The secondary battery 70 can be charged with power generated by the solar cell 80.

Although the electronic timepiece 200 has been described as above, the embodiment of the electronic device according to the invention is not limited thereto, and may be, for example, a mobile phone terminal, a smartphone, a tablet terminal, a wearable terminal, a camera, or the like.

Solar Cell

Next, the solar cell 80 to which the embodiment of the photoelectric conversion module according to the invention is applied and cells 80*a*, 80*b*, 80*c*, and 80*d* (embodiments of the photoelectric conversion element according to the invention) included in the solar cell 80 will be described in detail.

The solar cell 80 is a photoelectric conversion module that converts light energy into electric energy.

Figure 5:
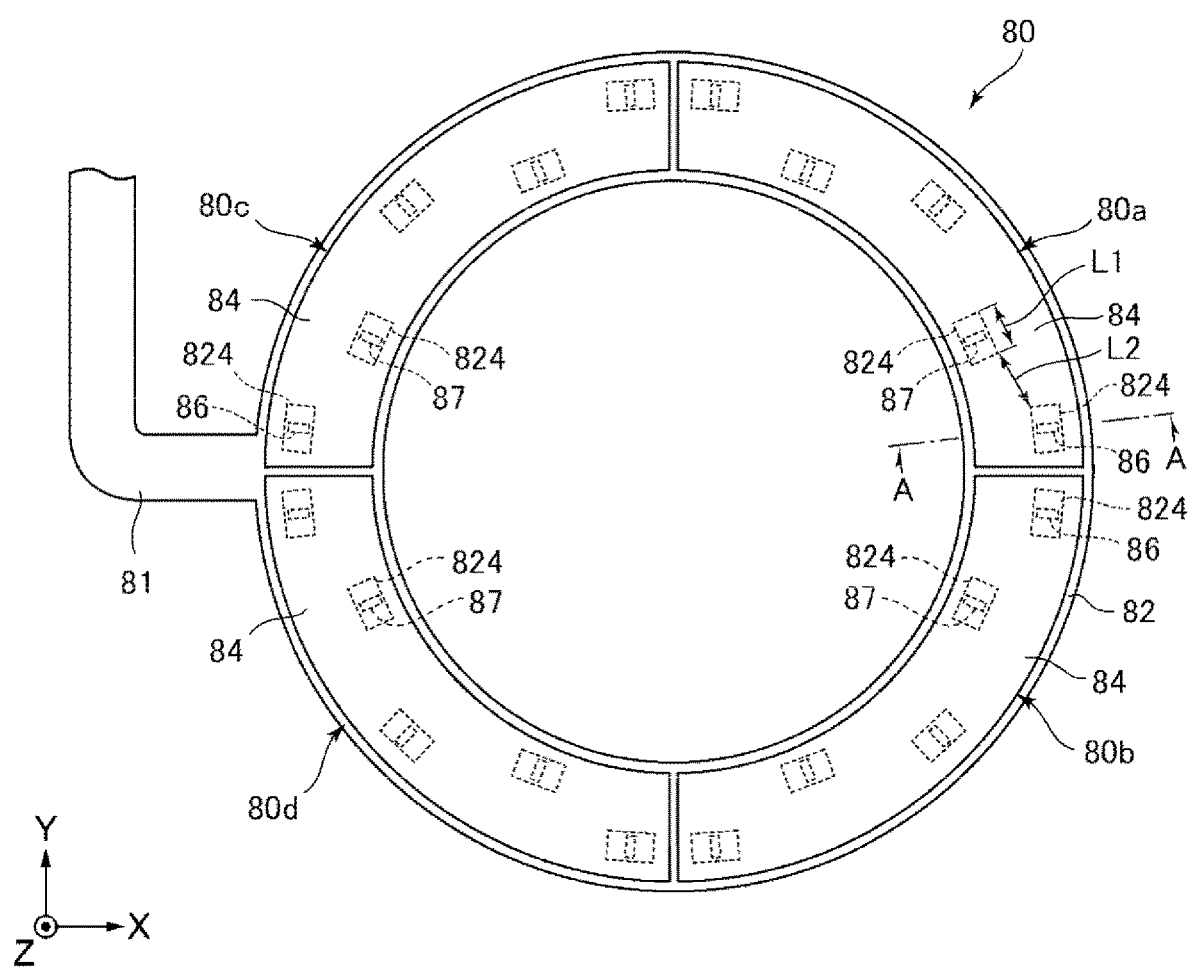
FIG. 5 is a plan view illustrating only a photoelectric conversion module of the electronic timepiece illustrated in FIG. 4.
Figure 6:
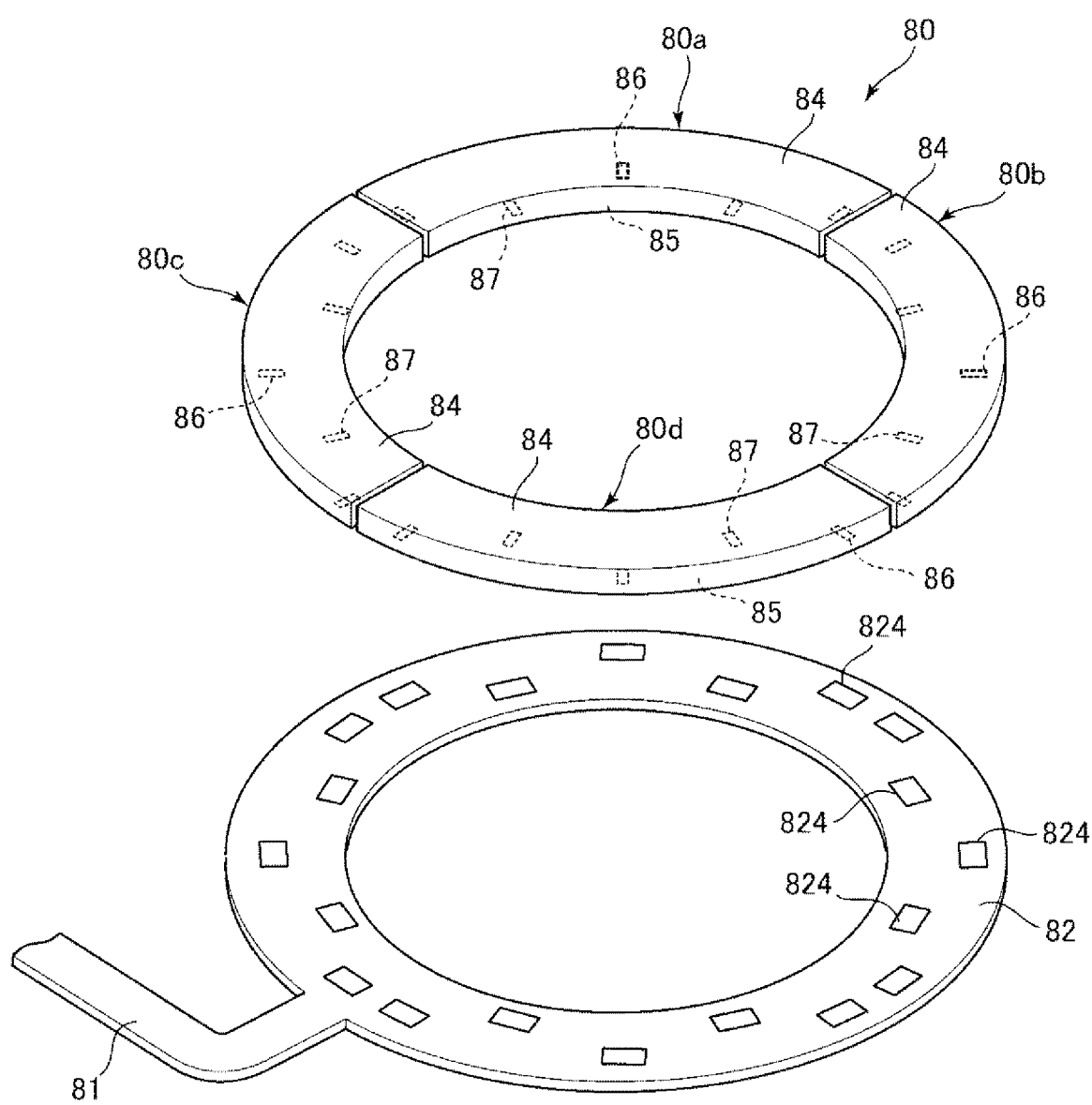
FIG. 6 is an exploded perspective view of the photoelectric conversion module illustrated in FIG. 5.

FIG. 5 is a plan view illustrating only the solar cell 80 of the electronic timepiece 200 illustrated in FIG. 4. FIG. 6 is an exploded perspective view of the solar cell 80 illustrated in FIG. 5.

The solar cell 80 (photoelectric conversion module) illustrated in FIG. 5 is provided between the windshield plate 55 and the electro-optical panel 60, and includes four cells 80*a*, 80*b*, 80*c*, and 80*d* (photoelectric conversion elements) and a wiring substrate 82 electrically connected to the four cells 80*a*, 80*b*, 80*c*, and 80*d*.

Each of the cells 80*a*, 80*b*, 80*c*, and 80*d* has a plate shape, and its main surface faces the Z-axis direction. Among the main surfaces of the cells 80*a*, 80*b*, 80*c*, and 80*d*, the main surface facing the windshield plate 55 is the light receiving surface 84 that receives external light. On the other hand, the main surface facing the electro-optical panel 60 is an electrode surface 85 on which electrode pads for extracting the generated power are provided.

A shape of the solar cell 80 illustrated in FIG. 5 in a plan view is a circular ring. In other words, by arranging the four cells 80*a*, 80*b*, 80*c*, and 80*d* with a slight gap therebetween, the overall shape in a plan view is a circular ring in which the inner edge shape (inner shape) and the outer edge shape (outer shape) are each circular.

On the other hand, since the opening 35 of the case 31 has a circular shape, the inner edge thereof includes a curve (circular arc).

According to such an electronic timepiece 200, it is possible to efficiently dispose the solar cell 80 while securing a space of a main part such as the display unit 50 with respect to the case 31 having the circular opening 35. With this configuration, since the solar cell 80 can be disposed close to the windshield plate 55, it is possible to sufficiently increase the power generation efficiency of the solar cell 80. On the other hand, since the disposition space of the display unit 50 can be secured in the center portion of the opening 35, visibility of the display unit 50 is improved and the balance of the disposition of the display unit 50 and the solar cell 80 is also improved. As a result, the electronic timepiece 200 that achieves both power generation efficiency of the solar cell 80 and overall designability is obtained.

It suffices that the opening 35 (of which inner edge) of the case 31 includes a curve at least in part, and includes, for example, a straight line and a curved line.

The "outer edge of the solar cell 80" means a portion of the outline of the solar cell 80 facing the outside of the opening 35, and the "inner edge of the solar cell 80" refers to a portion of the outline of the solar cell 80 facing the center side of the opening 35.

It is preferable that the inner edge and the outer edge of each of the cells 80*a*, 80*b*, 80*c*, and 80*d* are preferably a part of a circle (concentric circle) having the same center to each other in the four cells 80a, 80b, 80c, and 80d. In other words, when the assembly of the four cells 80a, 80b, 80c, and 80d forms a circular ring, it is preferable that inner circles and outer circles of the circular ring are concentric. With this configuration, it is possible to realize the electronic timepiece 200 having particularly high designability.

In the case of the electronic timepiece 200, a diameter of the outer circle is preferably approximately 15 mm or more to 80 mm or less, for example, and more preferably approximately 20 mm or more to 70 mm or less.

As illustrated in FIG. 3, the display unit 50 (electro-optical panel 60) is provided on an inner edge side of the solar cell 80, but the outer shape of the display unit 50 is along the inner edge of the solar cell 80. In other words, the electronic timepiece 200 includes the electro-optical panel 60 including the outer shape along the inner edge of the solar cell 80. By disposing the elements in this way, for example, the outer shape of the display unit 50 arranged inside the solar cell 80 can be made circular, so that it is possible to realize the electronic timepiece 200 with high designability.

At least a part of the solar cell 80 is disposed so as to overlap the outside of a pixel region of the electro-optical panel 60. With this configuration, for example, when the electronic timepiece 200 is viewed so as to look directly at the light receiving surface 84 of the solar cell 80, if the display unit 50 (electro-optical panel 60) is disposed at a position farther than the solar cell 80, the solar cell 80 can function as a so-called parting substrate covering the outside of the pixel area of the electro-optical panel 60.

In this embodiment, the solar cell 80 is constituted with the assembly of the four cells 80a, 80b, 80c, and 80d, but the number of cells may be one, or any number of two or more.

In the present embodiment, although the solar cell 80 has a circular ring shape in a plan view, the solar cell 80 may have a multiple ring in a plan view.

In addition, one or more of the four cells 80a, 80b, 80c, and 80d may be omitted, and the shapes of the cells may be different from each other.

The semiconductor substrate included in the solar cell 80 has crystallinity as described above. This crystallinity means single crystalline or polycrystalline. By including a semiconductor substrate having such crystallinity, it is possible to obtain the solar cell 80 with higher power generation efficiency as compared with a case of including a semiconductor substrate having amorphousness. In a case of generating the same power, the solar cell 80 makes it possible to further reduce an area. For that reason, by including the semiconductor substrate having crystallinity, it is possible to obtain the electronic timepiece 200 that achieves a high degree of compatibility between the power generation efficiency and designability.

In particular, it is preferable that the semiconductor substrate has single crystallinity. With this configuration, the power generation efficiency of the solar cell 80 is particularly enhanced. Accordingly, it is possible to maximize compatibility between power generation efficiency and designability. In particular, by saving the space of the solar cell 80, it is possible to further enhance the designability of the electronic timepiece 200. Furthermore, there is also an advantage that it is difficult for the power generation efficiency to be lowered even with low-intensity light such as indoor light.

The expression "having single crystallinity" includes not only a case where the entirety of the semiconductor substrate consists of single crystals, but also a case where apart thereof consists of polycrystals or amorphous materials. In the latter case, it is preferable that the volume of the single crystal is relatively large (for example, 90 vol % or more of the whole).

Examples of the semiconductor substrate may include a compound semiconductor substrate (for example, a GaAs substrate) and the like in addition to a silicon substrate.

The solar cell 80 is preferably a back surface electrode type solar cell. Specifically, as illustrated in FIG. 6, electrode pads 86 and 87 are provided on electrode surfaces 85 of the four cells 80a, 80b, 80c and 80d, respectively. Among the electrode pads 86 and 87, the electrode pad 86 is a positive electrode, and the electrode pad 87 is a negative electrode. Accordingly, power can be taken out from the electrode pad 86 and the electrode pad 87 through the wiring.

In the back surface electrode type solar cell, all the electrode pads can be disposed on the electrode surface 85 (back surface) side. For that reason, it is possible to maximize the light receiving surface 84, and it is possible to improve the power generation efficiency with the maximization of the light receiving area. In addition, it is possible to prevent deterioration in designability by providing the electrode pad on the light receiving surface 84 side. For that reason, designability of the electronic timepiece 200 can be further enhanced.

As illustrated in FIG. 5, the cells 80a, 80b, 80c, and 80d preferably include a plurality of electrode pads 86 and a plurality of electrode pads 87, respectively. With this configuration, a plurality of terminals having a potential difference can be provided in the cells 80a, 80b, 80c, and 80d. It is possible to prevent concentration of thermal stress occurring at the time of joining while maintaining mechanical strength between the cells 80a, 80b, 80c, and 80d and the wiring substrate 82.

The plurality of electrode pads 86 are disposed along the outer edge of the solar cell 80. On the other hand, the plurality of electrode pads 87 are disposed along the inner edge of the solar cell 80. By adopting such a disposition, it is possible to secure connection points along an extending direction (circumferential direction) of the solar cell 80. For that reason, the solar cell 80 can be more reliably fixed, and a connection resistance between the solar cell 80 and the wiring substrate 82 can be sufficiently reduced.

The disposition of the electrode pads 86 and 87 is not limited to that illustrated in the drawing, and the positions of the rows of the electrode pads 86 and the positions of the rows of the electrode pads 87 may be interchanged, for example.

The number of the electrode pads 86 and 87 per cell is also not particularly limited, each may be one or a plurality of any number. Also, the shapes of the electrode pads 86 and 87 are not particularly limited, and any shape may be adopted.

Figure 7:
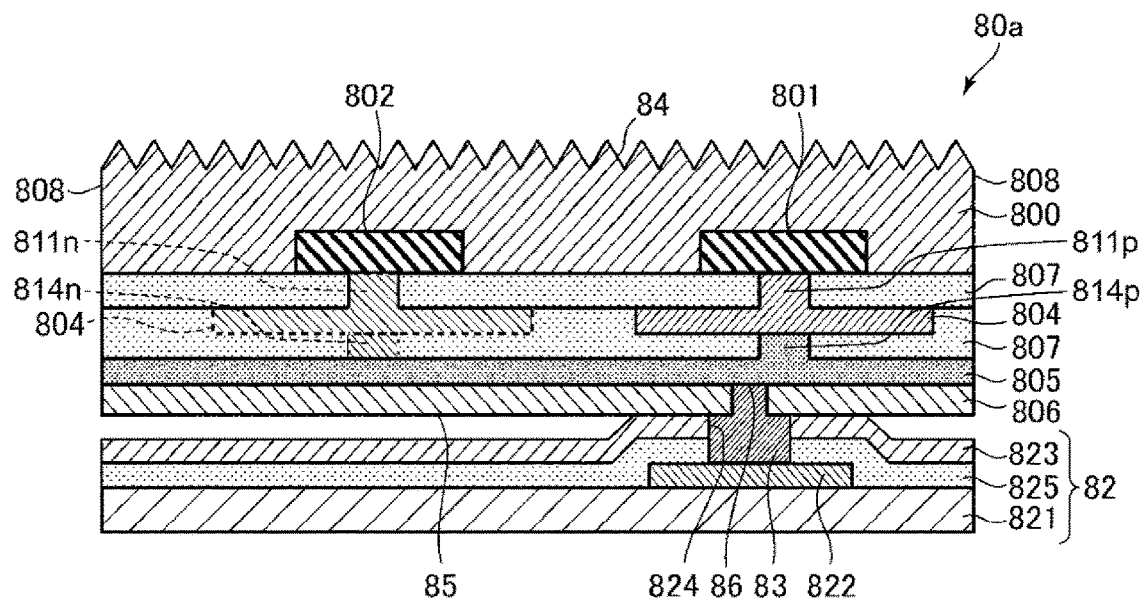
FIG. 7 is a cross-sectional view of the photoelectric conversion module illustrated in FIG. 5 taken along line A-A.

FIG. 7 is a cross-sectional view of the solar cell 80 taken along line A-A illustrated in FIG. 5. In FIG. 7, an example using a Si substrate 800 as a semiconductor substrate is illustrated.

The solar cell 80 illustrated in FIG. 7 includes a cell 80a and a wiring substrate 82.

Among the cell 80a and the wiring substrate 82, the cell 80a includes a Si substrate 800, a p+ impurity region 801 and an n+ impurity region 802 (both are dopant impurity regions) formed in the Si substrate 800, a finger electrode 804 (first electrode) connected to the p+ impurity region 801 and the n+ impurity region 802, and a bus bar electrode 805 (second electrode) connected to the finger electrode 804. In FIG. 7, for convenience of illustration, only the bus bar electrode 805 and the electrode pad 86 (positive electrode terminal) connected to the p+ impurity region 801 are illustrated, and the bus bar electrode and the electrode pad (negative electrode terminal) connected to the n+ impurity region 802 are not illustrated. In FIG. 7, the finger electrode 804 connected to the n+ impurity region 802 is indicated by a broken line, which indicates that the finger electrode 804 is not electrically connected to the bus bar electrode 805.

As the Si substrate 800, for example, a Si (100) substrate or the like is used. The crystal plane of the Si substrate 800 is not particularly limited, and may be a crystal plane other than the Si (100) plane.

Although it is preferable that the concentration of impurity elements other than the main constituent elements of the Si substrate 800 (semiconductor substrate) is as low as possible, the concentration of impurity elements is more preferably $1 \times 10^{11}$ [atoms/cm$^2$] or less, and still more preferably $1 \times 10^{-0}$ [atoms/cm$^2$] or less. By controlling the concentration of the impurity element to be within the range described above, the influence of the impurity of the Si substrate 800 on photoelectric conversion can be suppressed sufficiently small. With this configuration, it is possible to realize a solar cell 80 capable of generating sufficient power even in a small area. Furthermore, there is also an advantage that it is difficult for the power generation efficiency to be lowered even with low-intensity light such as indoor light.

The concentration of the impurity elements of the Si substrate 800 can be measured by, for example, an inductively coupled plasma-mass spectrometry (ICP-MS) method.

A part of the bus bar electrode 805 connected to the p+ impurity region 801 is exposed to constitute the electrode pad 86 described above. On the other hand, a part of a bus bar electrode (not illustrated) connected to the n+ impurity region 802 is exposed to constitute the electrode pad 87 described above.

As illustrated in FIG. 7, the electrode pad 86 is connected to the wiring substrate 82 through a conductive connection portion 83. Similarly, the electrode pad 87 is also connected to the wiring substrate 82 through a conductive connection portion (not illustrated).

As the conductive connection portion 83, for example, a conductive paste, a conductive sheet, conductive adhesive, a metal material, solder, a brazing filler, and the like may be included.

An uneven shape (texture) is formed on the light receiving surface 84 of the Si substrate 800. The texture is constituted with, for example, a large number of pyramidal projections formed on the light receiving surface 84. By providing such a texture, it is possible to suppress reflection of external light on the light receiving surface 84 and increase the amount of light incident on the Si substrate 800.

In the case where the Si substrate 800 is a substrate having, for example, a Si (100) plane as a main plane, pyramidal projections having an Si (111) plane as an inclined plane is suitably used as textures.

The solar cell 80 includes a passivation film (not illustrated) provided on the light receiving surface 84. This passivation film may have a function of an anti-reflection film. On the other hand, the solar cell 80 includes a passivation film 806 provided on the electrode surface 85.

The finger electrode 804 and the Si substrate 800 are insulated from each other with an interlayer insulating film 807 interposed therebetween and the bus bar electrode 805 and the finger electrode 804 are insulated from each other with the interlayer insulating film 807 interposed therebetween.

Examples of the constituent material of the passivation film 806 and the interlayer insulating film 807 include silicon oxide, silicon nitride, silicon oxynitride, aluminum oxide, and the like.

As the constituent material of the finger electrode 804 and the bus bar electrode 805, for example, a simple substance of metal such as aluminum, titanium, copper, an alloy, or the like may be included.

A length d (see FIG. 3) of a gap between the cells 80*a*, 80*b*, 80*c*, and 80*d* is not particularly limited, but is preferably 0.05 mm or more and 3 mm or less, more preferably 0.1 mm or more and 1 mm or less. By setting the length d of the gap to be within the range described above, it is possible to make an end surface 808 illustrated in FIG. 7 more difficult to see when the solar cell 80 is viewed from the light receiving surface 84 side. With this configuration, it is possible to suppress deterioration in designability (deterioration of aesthetic appearance) due to viewing of the end surface 808. In addition, it is also useful from the viewpoint of avoiding the problem of difficulty in assembling the solar cell 80 due to the length d of the gap being too short and the problem that the cells easily come into contact with each other.

The thickness of each of the cells 80*a*, 80*b*, 80*c*, and 80*d* is not particularly limited, but is preferably 50 μm or more and 800 μm or less, and more preferably 100 μm or more and 300 μm or less. With this configuration, it is possible to achieve both of the photoelectric conversion efficiency and the mechanical characteristics of the solar cell 80. Further, the thickness set within the range described above contributes to thinning of the electronic timepiece 200.

The wiring substrate 82 includes an insulating substrate 821 and a conductive film 822 provided thereon.

Examples of the insulating substrate 821 include various resin substrates such as a polyimide substrate and a polyethylene terephthalate substrate. As the constituent material of the conductive film 822, for example, copper or a copper alloy, aluminum or an aluminum alloy, silver or a silver alloy or the like may be included.

The wiring substrate 82 is provided so as to overlap the four cells 80*a*, 80*b*, 80*c*, and 80*d*. Such a wiring substrate 82 includes the insulating substrate 821, the conductive film 822 provided over the insulating substrate 821, and the insulating film 823 including the opening 824 in a portion overlapping the conductive film 822.

The expression of "the wiring substrate 82 overlaps the four cells 80*a*, 80*b*, 80*c*, and 80*d*" means a state in which the wiring substrate 82 overlaps at least one cell in a plan view of the wiring substrate 82. Also, in that case, it is not necessary that the wiring substrate 82 overlaps the whole of one cell, but it suffices that the wiring substrate 82 overlaps at least a part of one cell.

In this embodiment, the wiring substrate 82 overlaps the four cells 80*a*, 80*b*, 80*c*, and 80*d*.

As the insulating substrate 821, for example, various resin substrates such as a polyimide substrate and a polyethylene terephthalate substrate may be included.

As the constituent material of the conductive film 822, for example, copper or a copper alloy, aluminum or an aluminum alloy, silver or a silver alloy or the like may be included.

As the constituent material of the insulating film 823, for example, various resin materials such as a polyimide resin and a polyethylene terephthalate resin may be included.

In addition, the insulating substrate 821 and the insulating film 823 are adhered through an adhesive layer 825.

As the constituent material of the adhesive layer 825, for example, an epoxy-based adhesive, a silicone-based adhesive material, an olefin-based adhesive, an acrylic-based adhesive, and the like may be included.

Although the thickness of the wiring substrate 82 is not particularly limited, it is preferably 50 μm or more and 3 mm or less, and more preferably 100 μm or more and 500 μm or less. By setting the thickness of the wiring substrate 82 within the above range, it is possible to make the solar cell 80 (photoelectric conversion module) thinner while maintaining the mechanical strength of the conductive film 822 in the wiring substrate 82.

Electrode and Terminal

Figure 8:
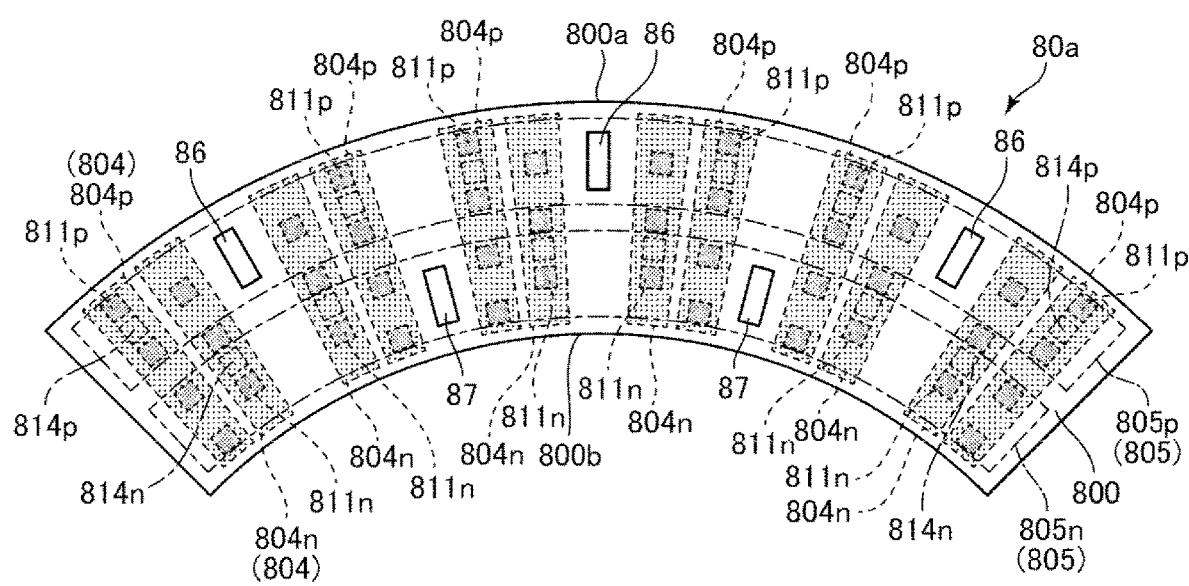
FIG. 8 is a plan view illustrating an electrode surface of a photoelectric conversion element illustrated in FIG. 6.

FIG. 8 is a plan view illustrating the electrode surface 85 of the cell 80*a* illustrated in FIG. 6. In FIG. 8, the finger electrodes 804 and the bus bar electrodes 805 covered by the passivation film 806 are illustrated so as to be seen through.

Figure 9:
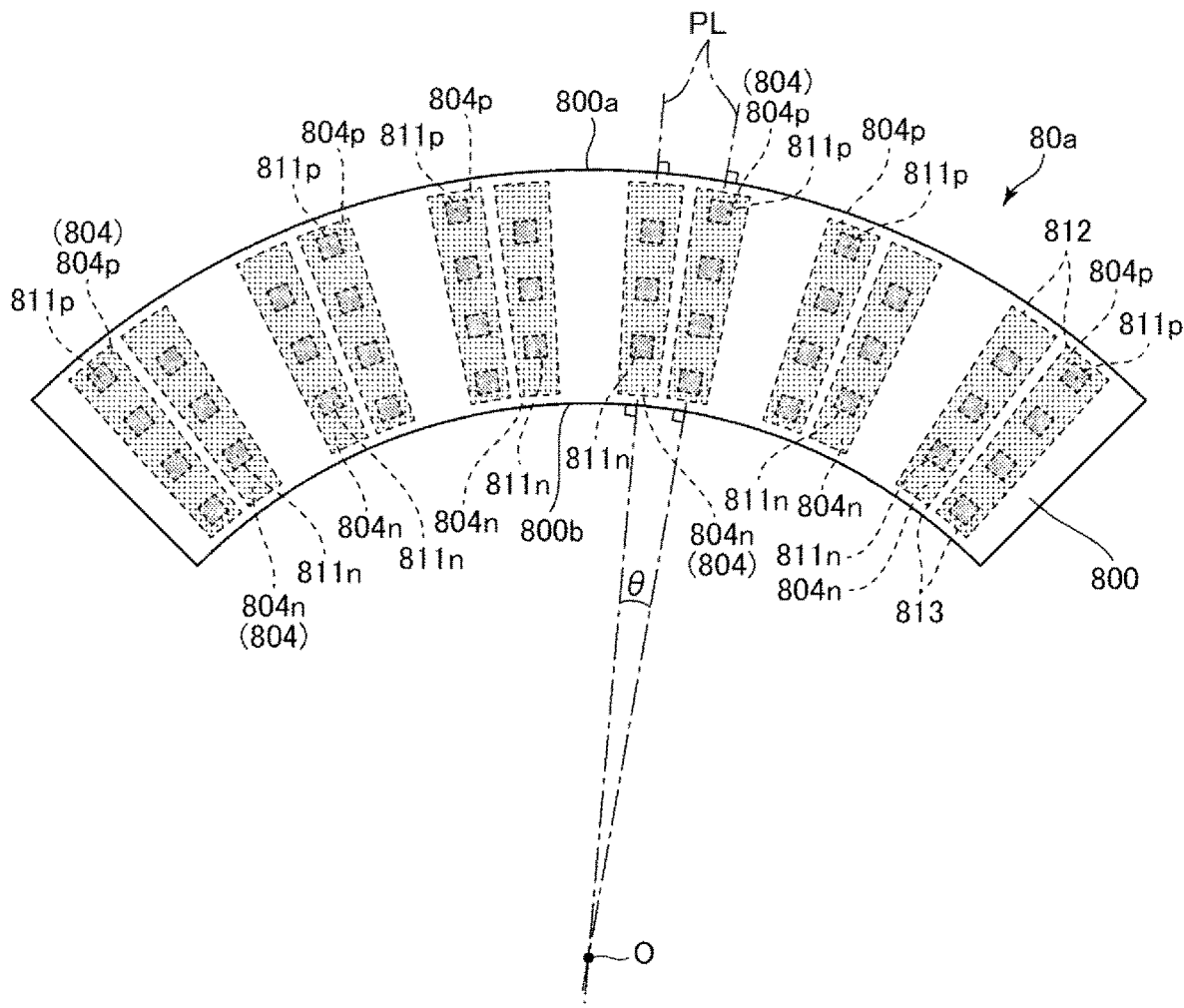
FIG. 9 is a view selectively illustrating first electrodes in the plan view illustrated in FIG. 8.
Figure 10:
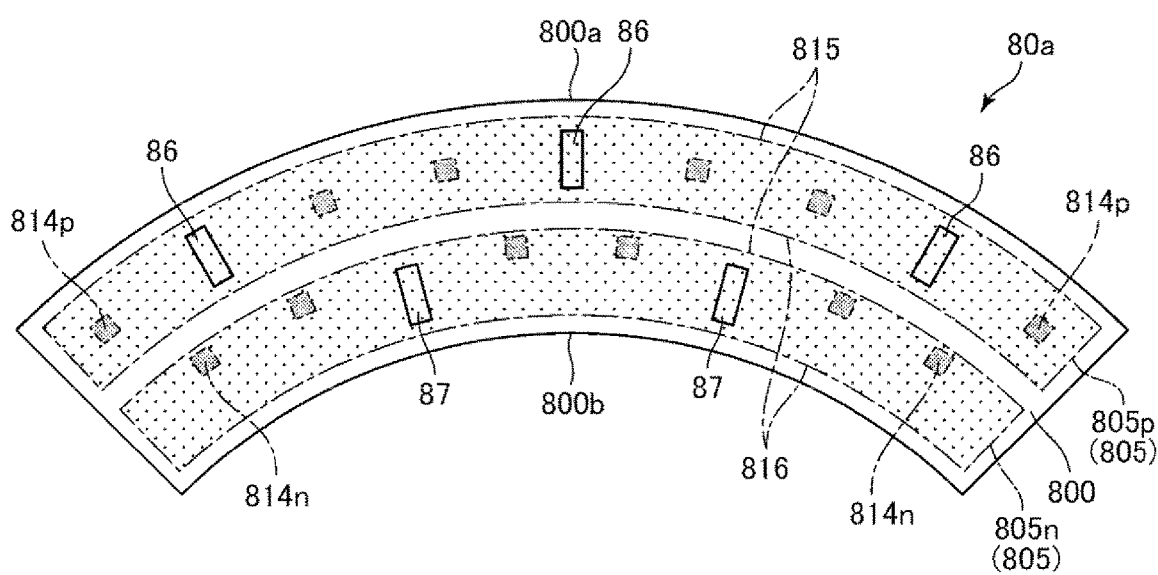
FIG. 10 is a view selectively illustrating second electrodes and terminals in the plan view illustrated in FIG. 8.

FIG. 9 selectively illustrates the finger electrode 804 in the plan view illustrated in FIG. 8, and FIG. 10 selectively illustrates the bus bar electrode 805 and the electrode pads 86 and 87 in the plan view illustrated in FIG. 8. Since the finger electrode 804 and the bus bar electrode 805 are different in hierarchy from each other, the finger electrode 804 and the bus bar electrode 805 are illustrated separately for each hierarchy in FIGS. 9 and 10.

In the following description, the cell 80*a* will be described as a representative, but description thereof is also applied to the cells 80*b*, 80*c*, and 80*d*.

As illustrated in FIGS. 8 to 10, the cell 80*a* includes the Si substrate 800. The Si substrate 800 includes two circular arcs in its contour. Among the two circular arcs, the circular arc corresponding to a part of the outer edge of the circular ring illustrated in FIG. 5 is a substrate outer edge 800*a*, and the circular arc corresponding to a part of the inner edge of the circular ring is a substrate inner edge 800*b*.

The cell 80*a* illustrated in FIGS. 8 to 10 includes a p-type finger electrode 804*p* provided so as to cover the p+ impurity region 801 (see FIG. 7) formed in the Si substrate 800 and a p+ contact 811*p* electrically connecting the p+ impurity region 801 and the p-type finger electrode 804*p*.

The cell 80*a* illustrated in FIGS. 8 to 10 includes an n-type finger electrode 804*n* provided so as to cover the n+ impurity region 802 (see FIG. 7) formed in the Si substrate 800 and an n+ contact 811*n* electrically connecting the n+ impurity region 802 and the n-type finger electrode 804*n*.

A plurality of the p+ contacts 811*p* are provided for one p-type finger electrode 804*p*. Accordingly, a plurality of p+ impurity regions 801 illustrated in FIG. 7 are also provided for one p-type finger electrode 804*p* according to provision of the plurality of the p+ contacts 811*p*. With this configuration, holes (carriers) generated by light reception can be efficiently extracted.

Similarly, a plurality of n+ contacts 811*n* are provided for one n-type finger electrode 804*n*. Accordingly, a plurality of n+ impurity regions 802 illustrated in FIG. 7 are also provided for one n-type finger electrode 804*n* according to provision of the plurality of n+ impurity regions 802. With this configuration, electrons (carriers) generated by light reception can be extracted efficiently.

The constituent materials of the p+ contact 811*p* and the n+ contact 811*n* are appropriately selected from, for example, those similar to the constituent material of the finger electrode 804 described above.

The finger electrode 804 described above indicates both the p-type finger electrode 804*p* and the n-type finger electrode 804*n*.

In FIGS. 8 and 9, relatively dense dots are given to the p+ contact 811*p* and the n+ contact 811*n*, and relatively sparse dots are attached to the finger electrode 804.

Furthermore, in FIG. 8, a part covered with the passivation film 806 is indicated by a broken line or a chain line, and a part exposed from the passivation film 806 is indicated by a solid line.

As illustrated in FIG. 8, a p-type bus bar electrode 805*p* and an n-type bus bar electrode 805*n* are covered with the passivation film 806. With this configuration, these electrodes are protected from an external environment.

Electrode Pad (Terminal)

On the other hand, a contact hole is provided in a part of the passivation film 806, and a part of the p-type bus bar electrode 805*p* and the n-type bus bar electrode 805*n* is exposed. Among the bus bar electrodes 805*n* and 805*p*, an exposed surface of the p-type bus bar electrode 805*p* serves as the electrode pad 86 (positive electrode terminal) described above and an exposed surface of the n-type bus bar electrode 805*n* serves as the electrode pad 87 (negative electrode terminal) described above.

As illustrated in FIG. 10, the cell 80*a* according to the present embodiment includes a plurality of electrode pads 86 and a plurality of electrode pads 87. By providing a conductive connection portion 83 between the electrode pads 86 and 87 and the conductive film 822 of the wiring substrate 82, it is possible to electrically and mechanically connect the cell 80*a* and the wiring substrate 82.

As illustrated in FIGS. 8 and 10, the plurality of electrode pads 86 are arranged along a substrate outer edge 800*a* (circumferential direction of the circular arc included in the substrate outer edge 800*a*). That is, an arrangement axis of the electrode pads 86 is substantially parallel to the substrate outer edge 800*a*. On the other hand, the plurality of electrode pads 87 are arranged along the substrate inner edge 800*b*. That is, the arrangement axis of the electrode pads 87 is substantially parallel to the substrate inner edge 800*b*. By adopting such an arrangement, a connection point with the wiring substrate 82 can be ensured along the extending direction (circumferential direction of the circular arc included in the substrate outer edge 800*a*) of the cell 80*a*. For that reason, it is possible to securely fix the cell 80*a* to the wiring substrate 82, and it is possible to sufficiently reduce a connection resistance between the cell 80*a* and the wiring substrate 82.

Figure 11:
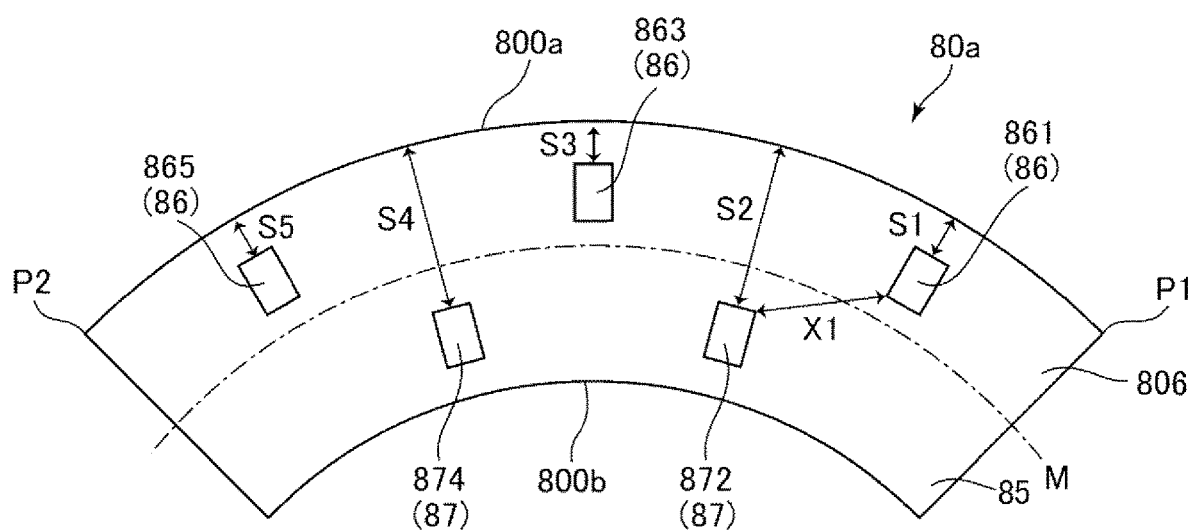
FIG. 11 is a view selectively illustrating terminals in the plan view illustrated in FIG. 10.

Here, FIG. 11 is a diagram selectively illustrating the electrode pads 86 and 87 in the plan view illustrated in FIG. 10.

The cell 80*a* illustrated in FIG. 11 includes three electrode pads 86 (positive electrode terminals) and two electrode pads 87 (negative electrode terminals). Here, for convenience of explanation, the three electrode pads 86 are referred to as a first terminal 861, a third terminal 863, and a fifth terminal 865 in order from the right side in FIG. 11. The two electrode pads 87 are referred to as a second terminal 872 and a fourth terminal 874 in order from the right side in FIG. 11.

The first terminal 861, the third terminal 863, and the fifth terminal 865 are respectively provided at positions deviated toward the substrate outer edge 800*a* from the intermediate line M in the electrode surface 85 of the cell 80*a*. On the other hand, the second terminal 872 and the fourth terminal 874 are respectively provided at positions deviated toward the substrate inner edge 800*b* side from the intermediate line M in the electrode surface 85 of the cell 80*a*.

To summarize the matters described above, the cell 80*a* (photoelectric conversion element) according to this embodiment includes the Si substrate 800 (semiconductor substrate) including the substrate outer edge 800*a* and the substrate inner edge 800*b* that include a curve (circular arc), the finger electrode 804 and the bus bar electrode 805 provided on the electrode surface (one surface) 85 side of the Si substrate 800, the first terminal 861 and the third terminal 863 and the fifth terminal 865 which are similarly provided on the electrode surface 85 side and are electrically connected to these electrodes, and the second terminal 872 and the fourth terminal 874 which are similarly provided on the electrode surface 85 side and are electrically connected to the electrodes described above.

Since the first terminal 861, the third terminal 863, and the fifth terminal 865 are provided so as to be shifted toward the substrate outer edge 800a side, it can be said that the distances from the substrate outer edge 800a to the first terminal, the third terminal, and the fifth terminal are smaller than any of the distances from the substrate outer edge 800a to the second terminal 872 and the fourth terminal 874, respectively.

On the other hand, since the second terminal 872 and the fourth terminal 874 are provided so as to be shifted toward the substrate inner edge 800b side, the distances from the substrate outer edge 800a to the second and fourth terminals are larger than any of the distances from the substrate outer edge 800a to the first terminal 861, the third terminal 863, and the fifth terminal 865, respectively.

That is, the distances from the substrate outer edge 800a to the second terminal 872 and the fourth terminal 874 are larger than any of the distances from the substrate outer edge 800a to the first terminal 861, the third terminal 863, and the fifth terminal 865.

Then, these terminals are arranged from the right side to the left side in FIG. 11 in such a way that the first terminal 861, the second terminal 872, the third terminal 863, the fourth terminal 874, and the fifth terminal 865 are arranged in this order along the substrate outer edge 800a of the Si substrate 800. As a result, these terminals are arranged in a so-called "staggered arrangement".

With such an arrangement, the conductive connection portions 83 joined to these terminals are also arranged in the same manner. Accordingly, the cell 80a is supported at multiple points on the wiring substrate 82 with the positions of these terminals as support points. The staggered arrangement described above provides an effect of improving vibration characteristics and making cracks less likely to occur due to vibration or the like. That is, since the terminals having different distances from the substrate outer edge 800a are alternately arranged along the substrate outer edge 800a, it is possible to support the cell 80a without providing a portion where large deflection is likely to occur even in a case where the substrate outer edge 800a includes a curve. As a result, it is possible to suppress occurrence of defects such as warping or cracking of the Si substrate 800 due to vibration or the like.

Even in a case where a large impact or vibration is applied to the cell 80a, natural vibration generated in the cell 80a can be aggregated in a short cycle mode. In other words, it is possible to effectively suppress long-period natural vibration which is likely to cause defects such as cracking in the cell 80a. With this configuration, impact resistance and vibration resistance of the cell 80a can be enhanced.

The effect described above is brought about by arranging at least four terminals, that is, the first terminal 861, the second terminal 872, the third terminal 863, and the fourth terminal 874 in a staggered arrangement. Accordingly, as in this embodiment, the fifth terminal 865 may be added, and the total number of terminals may be six or more. Even in a case where the total number of terminals is 5 or more, it is preferable that the staggered arrangement is continued.

When it is assumed that the distance between the substrate outer edge 800a and the first terminal 861 is S1, the distance between the substrate outer edge 800a and the second terminal 872 is S2, the distance between the substrate outer edge 800a and the third terminal 863 is S3, the distance between the substrate outer edge 800a and the fourth terminal 874 is S4, and the distance between the substrate outer edge 800a and the fifth terminal 865 is S5, a magnitude relationship between S2 and S4 and the magnitude relation between S1 and S3 and S5 are not particularly limited as long as the relationship of (S2, S4)>(S1, S3, S5) is satisfied.

However, from the viewpoint of further alleviating vibration causing defects and the concentration of the thermal stress which occurs at the time of joining, it is preferable that S2 and S4 are approximately the same degree with each other, and it is preferable that S1, S3 and S5 also are approximately the same degree with each other. The term of "approximately the same degree" means, for example, a state in which S2 is approximately equal to or greater than 0.8 times and equal to or less than 1.2 times of S4 and a state in which S1 is approximately 0.8 times or more and 1.2 times or less of S3 and is approximately 0.8 times or more and 1.2 times or less of S5.

The so-called staggered arrangement also has an advantage that unintended resonance caused due to multi-point support hardly occurs. For example, when the relationship such as (S2, S4)=(S1, S3, S5) is satisfied, there is a concern that unintended resonance occurs. Since there is a concern that unintended resonance leads to cracking or chipping of the cell 80a, it is possible to further improve reliability of the cell 80a by suppressing occurrence of such resonance.

Furthermore, by making the number of support points multiple points, it is possible to moderately reduce an area of one support point. For that reason, it is possible to prevent the thermal stress generated at the time of joining the photoelectric element and the substrate from increasing when the terminal stress concentrates at the end portion of each support point and to prevent occurrence of joining failure such as cracking or peeling in the conductive connection portion 83.

For example, although areas of the first terminal 861, the second terminal 872, the third terminal 863, the fourth terminal 874, and the fifth terminal 865 are different according to the size of the Si substrate 800, the areas are preferably 0.05 mm$^2$ or more and 2 mm$^2$ or less, and more preferably 0.1 mm$^2$ or more and 1 mm$^2$ or less, respectively. With this configuration, it is possible to prevent occurrence of joining failure such as cracks and peeling in the conductive connection portion 83.

The first terminal 861, the third terminal 863, and the fifth terminal 865 are preferably positioned close to the substrate outer edge 800a from the intermediate line M (see FIG. 11) between the substrate outer edge 800a and the substrate inner edge 800b. On the other hand, the second terminal 872 and the fourth terminal 874 are preferably positioned close to the substrate inner edge 800b from the intermediate line M. With this configuration, the terminals can be disposed relatively evenly on the electrode surface 85 of the cell 80a without being biased. As a result, the support points for supporting the cells 80a are evenly dispersed, so that the natural vibration can be suppressed to a short period and favorable vibration characteristics can be obtained. It is possible to suppress occurrence of defects due to stress concentrating locally.

The disposition of the electrode pads 86 and 87 is not limited to that illustrated in the drawing, and a position of a row of the electrode pads 86 and a position of a row of the electrode pads 87 may be interchanged, for example. That is, the positive electrode terminal may be disposed on the substrate inner edge 800b side, and the negative electrode terminal may be disposed on the substrate outer edge 800a side.

Also, the shapes of the electrode pads 86 and 87 are not particularly limited, and any shape may be adopted. As an example, the shapes of the electrode pads 86 and 87 illustrated in FIG. 11 are each rectangular, but may be a circular shape such as a perfect circle, an ellipse, an oval, may be a polygon such as a triangle, a hexagon, an octagon, or may have other shapes.

Furthermore, from the viewpoint of more reliably avoiding concentration of stress near a specific terminal, it is preferable that the first terminal 861, the second terminal 872, the third terminal 863, the fourth terminal 874, and the fifth terminal 865 have the same shape, but may have shapes different from each other.

In addition to a form in which each of the electrode pads 86 and 87 is a continuous conductive region as in this embodiment, each of the electrode pads 86 and 87 may have a form in which each of the electrode pads 86 and 87 is a region divided into a plurality of regions, which are grouped.

The substrate outer edge 800a and the substrate inner edge 800b preferably include circular arcs concentric with each other. That is, it is preferable that the substrate outer edge 800a includes a relatively large circular arc, and the substrate inner edge 800b includes a relatively small circular arc. With this configuration, designing of the finger electrode 804 and the bus bar electrode 805 is facilitated and a balance of the structure of the cell 80a is optimized.

It is sufficient that the substrate outer edge 800a and the substrate inner edge 800b each include a curve, for example, a part of each of the substrate outer edge 800a and substrate inner edge 800b may be straight lines, may include curves other than circular arcs, or may include circular arcs which are not concentric with each other. In addition, the curve in this specification is a concept including a part of a polygon having a large number of corners due to limitations of manufacturing techniques when the curve is manufactured as a part of such a polygon.

The substrate outer edge 800a is longer than the substrate inner edge 800b. Considering this, it is preferable that the number of terminals positioned close to the substrate outer edge 800a side from the intermediate line M is larger than the number of terminals positioned close to the substrate inner edge 800b side from the intermediate line M. That is, in a case where the cell 80a has five terminals of the first terminal 861, the second terminal 872, the third terminal 863, the fourth terminal 874, and the fifth terminal 865, it is preferable that three terminals are positioned on the substrate outer edge 800a side and two terminals are provided on the substrate inner edge 800b side.

With this configuration, it is possible to reduce the difference between the distance between terminals on the substrate outer edge 800a side and the distance between terminals on the substrate inner edge 800b side. As a result, variations in the distance between the support points supporting the cells 80a are suppressed, and vibration causing defects and concentration of thermal stress occurring at the time of joining are less likely to occur.

An interval X1 between the terminals (see FIG. 11) varies depending on the shape of the Si substrate 800, the total number of the electrode pads 86 and 87, and the like. However, for example, when the maximum length of the Si substrate 800 is set as 100, it is preferably 1 or more and 40 or less, more preferably 3 or more and 30 or less, and further more preferably 5 or more and 25 or less. By setting the interval X1 between the terminals within the range described above, it is possible to sufficiently alleviate the vibration causing the defect in the cell 80a and the concentration of the thermal stress generated at the time of joining while securing sufficient mechanical strength and high photoelectric conversion efficiency for supporting the cell 80a. That is, when the interval X1 between the terminals is less than the lower limit value, there is a concern that the number of the electrode pads 86 and 87 increases more than necessary and the photoelectric conversion efficiency is lowered due to the reduction in the space for disposing a dopant impurity region. On the other hand, when the interval X1 between the terminals exceeds the upper limit value, there is a concern that an advantage of multi-point support becomes thinner, a portion where stress tends to concentrate is generated, or the mechanical strength is lowered due to a decrease in the number of support points.

As an example, although the interval X1 between the terminals differs according to the maximum length of the Si substrate 800 described above, the interval X1 is preferably, for example, approximately 1 mm or more and 20 mm or less, more preferably approximately 3 mm or more and 15 mm or less.

The interval X1 between the terminals means not only the distance between the first terminal 861 and the second terminal 872 illustrated in FIG. 11, but also the shortest distance between the terminals. For example, in the case of FIG. 11, the maximum length of the Si substrate 800 corresponds to a linear distance between a corner portion P1 and a corner portion P2 of the Si substrate 800.

In this embodiment, the p+ contact 811p, the n+ contact 811n, a p-type via wiring 814p, and an n-type via wiring 814n are disposed so as not to overlap in a plan view in the portion where the electrode pads 86 and 87 are provided (see FIG. 8). That is, as illustrated in FIG. 8, the electrode pads 86 and 87, the p+ contacts 811p, the n+ contact 811n, the p-type via wiring 814p, and the n-type via wiring 814n are displaced from each other in a plan view. With this configuration, the electrode pads 86 and 87 are not influenced by these contacts in shapes such as flatness thereof. For that reason, the electrode pads 86 and 87, which have high flatness and are difficult to cause contact failure, are obtained.

The invention is not limited to such a structure. For example, in a case where the influence on flatness is small even when a contact or the like is provided, the electrode pads 86 and 87 may overlap one of the p+ contact 811p, the n+ contact 811n, the p-type via wiring 814p, and the n-type via wiring 814n in a plan view.

Finger Electrode

As illustrated in FIG. 9, it is preferable that the finger electrode 804 extends in the extending direction of a perpendicular PL line of the curve included in the substrate outer edge 800a. That is, it is preferable that the cell 80a (photoelectric conversion element) includes the Si substrate 800 (semiconductor substrate) having the substrate outer edge 800a including a curve and the substrate inner edge 800b positioned on the inner side (inside the curve) of the substrate outer edge 800a and including a curve and the plurality of finger electrodes 804 (first electrodes) provided on one surface of the Si substrate 800, and the finger electrodes 804 extend in the perpendicular direction of curve included in the substrate outer edge 800a. With this configuration, in a case where the substrate outer edge 800a is a circular arc, the finger electrodes 804 extend along a straight line radially extending from the center of the circular arc.

On the other hand, in the cell 80*a* according to this present embodiment, the perpendicular line PL described above is orthogonal to the substrate inner edge 800*b*.

Further, it is preferable that the perpendicular line PL passes through the center O of the circular arc of the substrate outer edge 800*a*. That is, it is preferable that the circular arc is a perfect circle or a part of a shape close to the perfect circle. With this configuration, designing of the finger electrode 804 is facilitated and the balance of the structure of the cell 80*a* is optimized. As a result, deformation such as warping and cracking in the cell 80*a* is less likely to occur.

The plurality of finger electrodes 804 are provided in the cell 80*a*. For that reason, these finger electrodes 804 are arranged (aligned) along the substrate outer edge 800*a*. In other words, it can be said that an arrangement axis is substantially parallel to the substrate outer edge 800*a*. By arranging the finger electrodes 804 as described above, it is possible to make the shape and area of each finger electrode 804 uniform and it is possible to make the structure of the cell 80*a* uniform. As a result, deformation such as warping or cracking in the cell 80*a* hardly occurs. In addition, the finger electrode 804 can be laid on the Si substrate 800 without gaps as much as possible. With this configuration, the finger electrode 804 also functions as a reflecting film for reflecting light incident from the light receiving surface 84 on the electrode surface 85 side of the cell 80*a*. That is, by laying the finger electrodes 804 on the Si substrate 800 without gaps, light incident from the light receiving surface 84 and transmitted through the Si substrate 800 can be reflected with higher probability on the finger electrodes 804. With this configuration, the amount of light contributing to the photoelectric conversion can be increased, and the photoelectric conversion efficiency can be improved.

Furthermore, it is preferable that the finger electrodes 804 adjacent to each other at least have the same shape and have the same area. With this configuration, the structure of the cell 80*a* can be further uniformized.

The terms of the same shape, the same area, and the parallel are concepts that allow errors that occur during manufacturing, respectively.

In the case where the finger electrodes 804 are arranged along the substrate outer edge 800*a*, it is preferable that the p-type finger electrodes 804*p* and the n-type finger electrodes 804*n* are alternately arranged, but an arrangement of the p-type and n-type finger electrodes is not limited to such an array pattern and an array pattern partly or entirely different from the array pattern may be adopted.

A contour of the finger electrode 804 may be any shape, but in FIG. 9, the contour has a first electrode outer edge 812 facing the substrate outer edge 800*a* and a first electrode inner edge 813 facing the substrate inner edge 800*b*. The length of the first electrode outer edge 812 is longer than the length of the first electrode inner edge 813. That is, when the length of the finger electrode 804 illustrated in FIG. 9 in the extending direction of the substrate outer edge 800*a* is a "width", the width gradually increases from the first electrode inner edge 813 toward the first electrode outer edge 812.

According to the finger electrode 804 having such a contour shape, the finger electrodes 804 can be laid on the Si substrate 800 without gaps as much as possible while keeping the gap between the finger electrodes 804 constant. For that reason, it is possible to further enhance the function of the finger electrode 804 as a reflecting film while securing insulation between the finger electrodes 804.

The expression that the first electrode outer edge 812 faces the substrate outer edge 800*a* refers to a state where both the first electrode outer edge 812 and the substrate outer edge 800*a* are displaced while maintaining a substantially constant distance. Then, the expression of "keeping a constant distance" refers to matters that a change width of the separation distance between both the first electrode outer edge 812 and the substrate outer edge 800*a* is less than or equal to 100% of the maximum value of the separation distance (preferably, less than or equal to 10% of an average value of the separation distances) over the entire length of the first electrode outer edge 812.

Similarly, the expression that the first electrode inner edge 813 faces the substrate inner edge 800*b* refers to a state where both the first electrode inner edge 813 and the substrate inner edge 800*b* are displaced while maintaining a substantially constant distance. Then, the expression of "keeping a constant distance" refers to matters that a change width of the separation distance between both the first electrode inner edge 813 and the substrate inner edge 800*b* is less than or equal to 100% of the maximum value of the separation distance (preferably, less than or equal to 10% of an average value of the separation distances) over the entire length of the first electrode inner edge 813.

Two perpendicular lines PL illustrated in FIG. 9 pass through the centers of the widths of the two adjacent finger electrodes 804. As described above, each perpendicular line PL passes through the center O of the circular arc of the substrate outer edge 800*a*. Accordingly, an angle θ between the two perpendicular lines PL corresponds to a pitch between adjacent finger electrodes 804. This angle θ is appropriately set according to carrier mobility and the like in the Si substrate 800, but as an example, the angle θ is preferably 0.05° or more and 1° or less, more preferably 0.1° or more and 0.5° or less. With this configuration, the pitch between the contacts each of which is provided corresponding to each finger electrode 804 and the pitch between the dopant impurity regions are optimized, so that it is possible to improve extraction efficiency of carriers generated by light reception and to reduce recombination probability of the carriers. As a result, the cell 80*a* having particularly high photoelectric conversion efficiency can be obtained.

From the same viewpoints as described above, the width of the finger electrode 804 is preferably 5 μm or more and 100 μm or less, and more preferably 10 μm or more and 50 μm or less.

On the other hand, the interval between the finger electrodes 804 is preferably 1 μm or more and 50 μm or less, and more preferably 3 μm or more and 30 μm or less. With this configuration, it is possible to sufficiently increase the area occupied by the finger electrodes 804 while achieving insulation between the finger electrodes 804.

Bus Bar Electrode

On the other hand, as illustrated in FIGS. 8 and 10, the cell 80*a* includes the p-type bus bar electrode 805*p* and the n-type bus bar electrode 805*n* provided so as to straddle over the plurality of finger electrodes 804 and to cover these finger electrodes 804. The p-type bus bar electrode 805*p* is electrically connected to the plurality of p-type finger electrodes 804*p* through the p-type via wirings 814*p*, and the n-type bus bar electrode 805*n* is electrically connected to the plurality of n-type finger electrodes 804*n* through the n-type via wirings 814*n*.

A plurality of p-type via wirings 814p are provided for one p-type bus bar electrode 805p. Similarly, a plurality of n-type via wirings 814n are also provided for one n-type bus bar electrode 805n.

The constituent materials of the p-type via wiring 814p and the n-type via wiring 814n are appropriately selected, for example, from those similar to the constituent materials of the bus bar electrode 805 described above.

The bus bar electrode 805 described above indicates both the p-type bus bar electrode 805p and the n-type bus bar electrode 805n.

In FIG. 10, relatively dense dots are given to the p-type via wiring 814p and the n-type via wiring 814n, and relatively sparse dots are given to the bus bar electrode 805.

Here, as illustrated in FIGS. 8 and 10, the extending direction of the bus bar electrode 805 intersects the extending direction of the finger electrode 804. That is, as described above, the finger electrode 804 extends in the perpendicular direction of the substrate outer edge 800a, whereas the bus bar electrode 805 extends in the direction parallel to the substrate outer edge 800a. Accordingly, as illustrated in FIG. 8, when the Si substrate 800 is viewed in a plan view, the finger electrode 804 and the bus bar electrode 805 are substantially perpendicular to each other. With this configuration, the bus bar electrode 805 is disposed so as to straddle over the plurality of finger electrodes 804 and thus, in a case where the p-type via wiring 814p and the n-type via wiring 814n are disposed at the intersection of both the finger electrode 804 and the bus bar electrode 805, the bus bar electrode 805 becomes an effective current collector.

The "parallel direction" refers to a state in which the bus bar electrode 805 and the substrate outer edge 800a are displaced while maintaining a substantially constant distance. Then, the expression of "keeping a constant distance" refers to matters that a change width of the separation distance between both the bus bar electrode 805 and the substrate outer edge 800a is less than or equal to 100% of the maximum value of the separation distance (preferably, less than or equal to 10% of an average value of the separation distances) over the entire length of the bus bar electrode 805.

Further, an intersection angle between the finger electrode 804 and the bus bar electrode 805 is not limited to 90°, and the angle on the acute angle side may be about 30° or more and less than 90°. The bus bar electrode 805 is not necessarily required to be parallel to the substrate outer edge 800a, or may extend in a straight line.

As described above, the bus bar electrode 805 according to this embodiment overlaps the finger electrode 804 in the thickness direction of the Si substrate 800. With this configuration, there is no need to secure a space necessary for disposing the bus bar electrode 805, so that it is possible to more widely secure the space for disposing the finger electrode 804, the p+ impurity region 801, and the n+ impurity region 802 in the Si substrate 800. As a result, the number of carriers to be removed increases and the function as a reflective film of the finger electrode 804 is improved, so that the photoelectric conversion efficiency can be further increased.

The bus bar electrode 805 is insulated from the finger electrode 804 through an interlayer insulating film (not illustrated), while the bus bar electrode 805 is electrically connected to the finger electrode 804 via the p-type via wiring 814p and the n-type via wiring 814n penetrating the inter-layer insulation film.

In this case, the position of the p-type via wiring 814p in a plan view of the Si substrate 800 may overlap the position of the p+ contact 811p, but it is preferable that the p-type via wiring 814p is deviated. Similarly, the position of the n-type via wiring 814n in a plan view of the Si substrate 800 may overlap the position of the n+ contact 811n, but it is preferable that the n-type via wiring 814n is deviated. With this configuration, flatness of the base of the p-type via wiring 814p and the n-type via wiring 814n is increased, so that deviation of a formation position or the like is less likely to occur. For that reason, it is possible to suppress a decrease in manufacturing yield of the cell 80a.

Preferably, the position of the p-type via wiring 814p is positioned midway between the p+ contacts 811p, and the position of the n-type via wiring 814n is positioned midway between the n+ contacts 811n.

A contour of the bus bar electrode 805 may have any shape, but, in FIG. 10, has a second electrode outer edge 815 facing the substrate outer edge 800a and a second electrode inner edge 816 facing the substrate inner edge 800b. The length of the second electrode outer edge 815 is longer than the length of the second electrode inner edge 816. That is, when the length of the bus bar electrode 805 illustrated in FIG. 10 in the extending direction of the substrate outer edge 800a is a "width", the width gradually increases from the second electrode inner edge 816 to the second electrode outer edge 815.

According to the bus bar electrode 805 having such a contour shape, the bus bar electrode 805 has a shape similar to that of the Si substrate 800, that is, a shape obtained by cutting out a part of a circular ring. For that reason, with respect to the plurality of finger electrodes 804 laid on the whole of the Si substrate 800, the bus bar electrode 805 is allowed to easily intersect and the plurality of the p-type bus bar electrodes 805p and the n-type bus bar electrodes 805n can be easily arranged.

As described above, the finger electrode 804 and the bus bar electrode 805 are substantially orthogonal to each other. For that reason, it is possible to achieve the effect that the p-type via wiring 814p and the n-type via wiring 814n can be arranged easily at both intersections.

The expression that the second electrode outer edge 815 faces the substrate outer edge 800a refers to a state where both the second electrode outer edge 815 and the substrate outer edge 800a are displaced while maintaining a substantially constant distance. Then, the expression of "keeping a constant distance" refers to matters that a change width of the separation distance between both the second electrode outer edge 815 and the substrate outer edge 800a is less than or equal to 100% of the maximum value of the separation distance (preferably, less than or equal to 10% of an average value of the separation distances) over the entire length of the second electrode outer edge 815.

Similarly, the expression that the second electrode inner edge 816 faces the substrate inner edge 800b refers to a state where both the second electrode inner edge 816 and the substrate inner edge 800b are displaced while maintaining a substantially constant distance. Then, the expression of "keeping a constant distance" refers to matters that a change width of the separation distance between both the second electrode inner edge 816 and the substrate inner edge 800b is less than or equal to 100% of the maximum value of the separation distance (preferably, less than or equal to 10% of an average value of the separation distances) over the entire length of the second electrode inner edge 816.

Although the cell 80a has been described above as a representative example, the solar cell 80 (photoelectric conversion module) includes such a cell 80a (photoelectric conversion element), the wiring substrate 82 provided so as to overlap the cell 80*a*, and the conductive connection portion 83 for electrically connecting the electrode pads 86 and 87 of the cell 80*a* and the conductive film 822 of the wiring substrate 82. Accordingly, deformation such as large deflection due to vibrations or the like in the cell 80*a* is suppressed in the solar cell 80, and the solar cell 80 has high reliability that can suppress the defect such as cracking.

Wiring Substrate

Since at least a part of the electrode surface 85 of the cell 80*a* is covered by the wiring substrate 82, the electrode surface 85 is protected. For that reason, it is suppressed that foreign matter adheres to the electrode surface 85 or an external force is applied thereto. As a result, reliability of the electrode surface 85 can be secured.

The conductive connection portion 83 connects the cell 80*a* and the wiring substrate 82 not only electrically but also mechanically. For that reason, by optimizing the mechanical characteristics of the conductive connection portion 83, it is possible to alleviate the concentration of thermal stress occurring at the time of joining while maintaining the mechanical strength between the cells 80*a*, 80*b*, 80*c*, and 80*d* and the wiring substrate 82.

Specifically, the Young's modulus of the conductive connection portion 83 is preferably 0.5 GPa or more and 15 GPa or less, more preferably 1 GPa or more and 10 GPa or less, further more preferably 1.5 GPa or more and 6.5 GPa or less. By setting the Young's modulus of the conductive connection portion 83 within the range described above, distortion and the like can be absorbed in the conductive connection portion 83 while securing adhesive strength required for the conductive connection portion 83. For that reason, it is possible to achieve both reliability of mechanical connection based on high mechanical characteristics, and characteristics of alleviating vibration that causes defects occurring in the cell 80*a* and thermal stress occurring at the time of joining.

When the Young's modulus of the conductive connection portion 83 is lower than the lower limit value, the mechanical characteristics of the conductive connection portion 83 is lowered and thus, there is a concern that required joining strength cannot be satisfied depending on the specifications of the cell 80*a*. On the other hand, when the Young's modulus of the conductive connection portion 83 exceeds the upper limit value, deformability of the conductive connection portion 83 is reduced and thus, there is a concern that distortion of the cell 80*a* cannot be sufficiently absorbed in the conductive connection portion 83 depending on the specifications of the cell 80*a*, the cell 80*a* is cracked, or the defects such as cracking or peeling are generated in the conductive connection portion 83.

The Young's modulus of the conductive connection portion 83 is measured by a dynamic viscoelasticity measuring device (DMA) at 25° C., for example.

From the viewpoint of the Young's modulus described above, particularly, a conductive adhesive containing a resin material is preferably used as the conductive connection portion 83.

Examples of the resin material contained in the conductive adhesive include an epoxy-based resin, a urethane-based resin, a silicone-based resin, an acrylic resin, and the like, and these materials may be used alone or as a mixture of two or more thereof.

The electronic timepiece 200 (electronic device) includes the solar cell 80 including such four cells 80*a*, 80*b*, 80*c*, and 80*d* (photoelectric conversion elements). For that reason, the electronic timepiece 200 with high reliability can be obtained.

Solar Cell Manufacturing Method

Next, an example of a method of manufacturing the solar cell 80 illustrated in FIG. 7 will be described.

Figure 12:
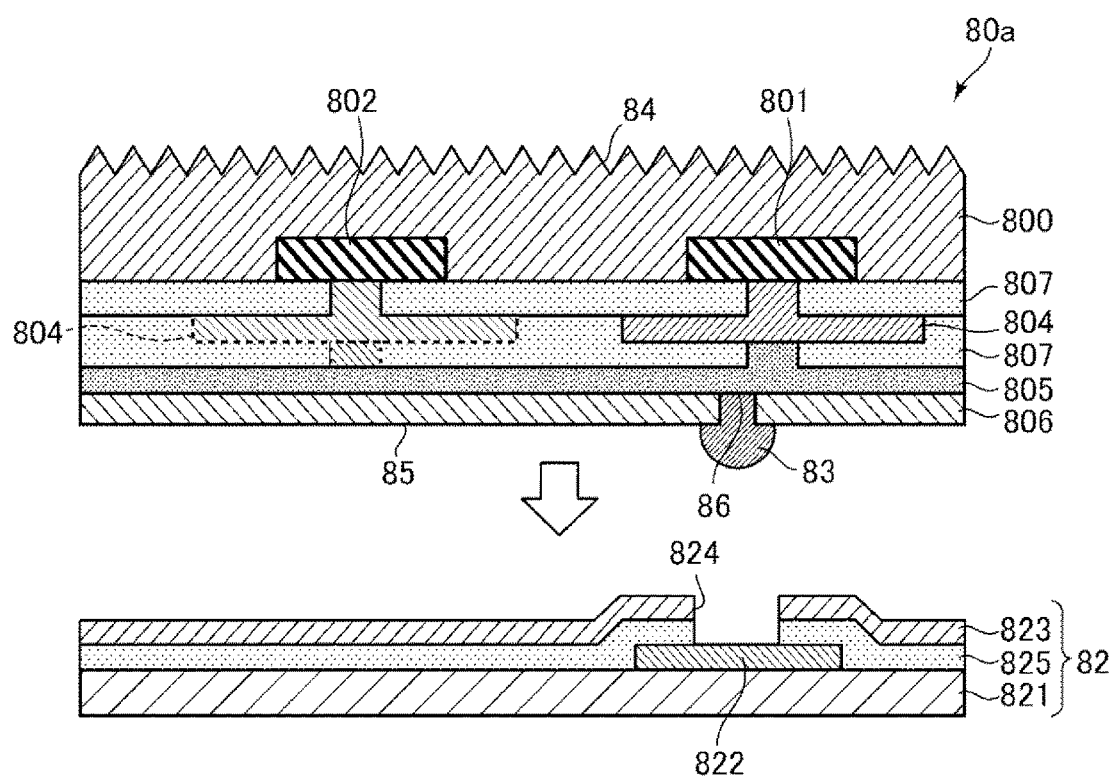
FIG. 12 is a view for explaining an example of a method of manufacturing the photoelectric conversion module illustrated in FIG. 7.
Figure 13:
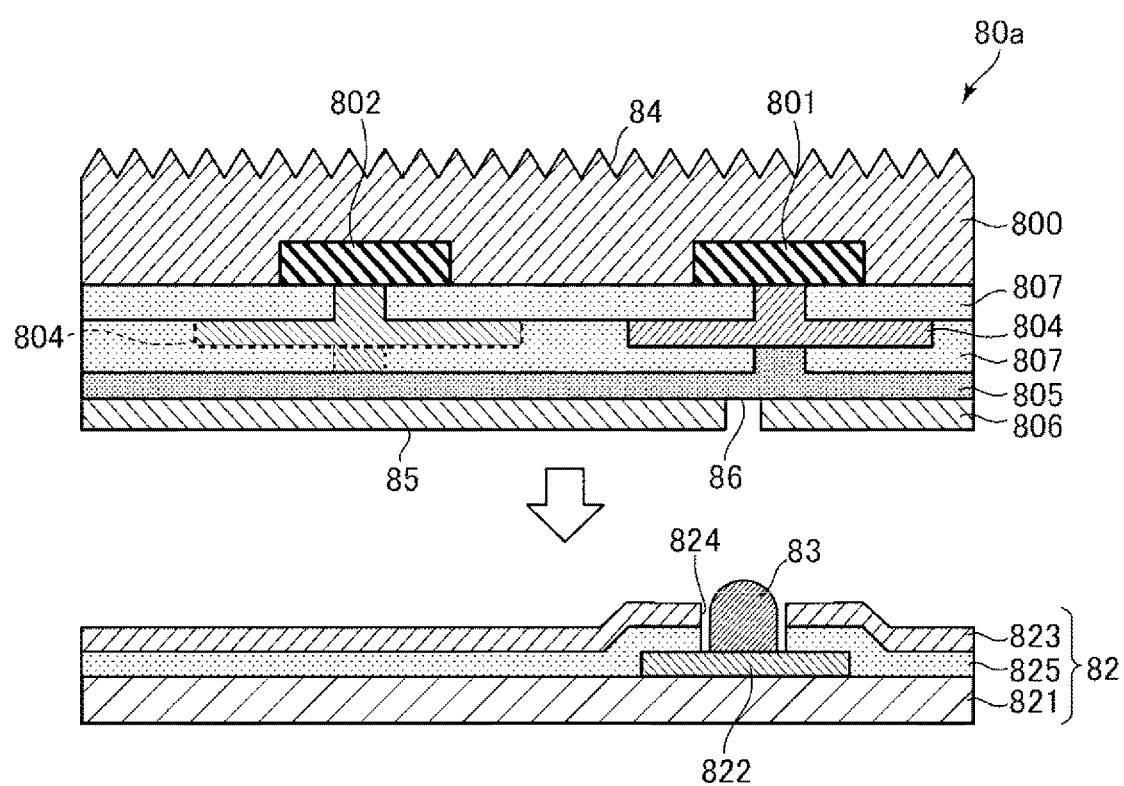
FIG. 13 is another view for explaining the example of the method of manufacturing the photoelectric conversion module illustrated in FIG. 7.

FIGS. 12 and 13 are diagrams for explaining an example of the method of manufacturing the solar cell 80 illustrated in FIG. 7.

The method of manufacturing the solar cell 80 illustrated in FIG. 7 includes a preparation step of preparing the cell 80*a* (photoelectric conversion element) and the wiring substrate 82 including insulating substrate 821, the conductive film 822, and an insulating film 823 including an opening 824 in a portion overlapping the conductive film 822, a step of disposing the conductive connection portion 83 having conductivity on at least one of the cell 80*a* and the opening 824, and a step of laminating the cell 80*a* and the wiring substrate 82 through the conductive connection portion 83.

Hereinafter, each step will be described sequentially.

[1] First, the cell 80*a* is prepared (preparation step). The cell 80*a* is manufactured by, for example, forming a dopant impurity region or the like in a semiconductor wafer, forming an electrode and an insulating film thereon, and then dividing the formed electrode and insulating film into individual pieces.

[2] The conductive connection portion 83 having conductivity is disposed on at least one of the cell 80*a* and the opening 824 (disposition step). Specifically, as illustrated in FIG. 12, the conductive connection portion 83 may be disposed on the electrode pad 86 of the cell 80*a*. As illustrated in FIG. 13, the conductive connection portion 83 may be disposed on the opening 824 of the wiring substrate 82.

The conductive connection portion 83 illustrated in FIG. 12 is disposed so as to be in contact with the electrode pad 86 of the cell 80*a*. On the other hand, the conductive connection portion 83 illustrated in FIG. 13 is disposed so as to be in contact with the opening 824 of the wiring substrate 82. The conductive connection portion 83 disposed in this manner electrically connects the electrode pad 86 of the cell 80*a* and the opening 824 of the wiring substrate 82 in a lamination step which will be described later.

The volume of the conductive connection portion 83 disposed in this manner is preferably equal to or less than the volume of the opening 824. With this configuration, in the lamination step to be described later, the entire amount of the conductive connection portion 83 can be accommodated in the opening 824. In other words, it is possible to prevent the conductive connection portion 83 from overflowing from the opening 824. As a result, it is possible to prevent the overflowed conductive connection portion 83 from causing short-circuiting or from becoming defective in appearance.

The "volume of the conductive connection portion 83" means a volume of a portion positioned below a plane including the lower surface (lower surface of the passivation film 806) of the cell 80*a* illustrated in FIG. 7. For example, in a case where the electrode pad 86 is retracted upward as illustrated in FIG. 7, the conductive connection portion positioned above the plane including the lower surface of the cell 80*a* is not included in the "volume of the conductive connection portion 83".

Further, the "volume of the opening 824" in the invention means a volume of a bottomed recessed portion in which the conductive film 822 is exposed on the bottom surface and end surfaces of the insulating film 823 and the adhesive layer 825 are inner surfaces.

Although the depth of the opening 824 differs according to the thicknesses of the insulating film 823 and the adhesive layer 825 and thus, the depth is not particularly limited, as an example, it is preferably 1 μm or more and 100 μm or less and more preferably 2 μm or more and 50 μm or less. With this configuration, it is possible to obtain the conductive connection portion 83 having a thickness that can exhibit sufficient strength of adhesive strength while preventing the solar cell 80 from becoming too thick. For that reason, a more reliable solar cell 80 can be obtained.

In a case where the conductive connection portion 83 is disposed so as to be in contact with the electrode pad 86 of the cell 80a, the shape of the conductive connection portion 83 is preferably formed into a shape protruding downward as illustrated in FIG. 12, that is, a shape protruding toward the wiring substrate 82 side in the lamination step which will be described later. The conductive connection portion 83 is brought into contact with the conductive film 822 exposed on the bottom surface of the opening 824 of the wiring substrate 82 with a high probability in the lamination step, which will be described later, by being formed into such a shape. With this configuration, it is possible to securely establish electrical connection between the electrode pad 86 of the cell 80a and the opening 824 of the wiring substrate 82 through the conductive connection portion 83.

A protrusion height of the conductive connection portion 83 illustrated in FIG. 12 is appropriately set according to the shape of the opening 824, but it is preferable that the protrusion height is higher than the depth of the opening 824. With this configuration, in the lamination step which will be described later, it is possible to more securely connect the electrode pad 86 of the cell 80a and the opening 824 of the wiring substrate 82 by the conductive connection portion 83.

The protrusion height of the conductive connection portion 83 illustrated in FIG. 12 is preferably set to 101% or more and 1000% or less of the depth of the opening 824, more preferably 110% or more and 750% or less, further more preferably 120% or more and 500% or less. With this configuration, it is possible to more reliably connect the electrode pad 86 of the cell 80a and the opening 824 of the wiring substrate 82 by the conductive connection portion 83.

The "protrusion height of the conductive connection portion 83" means a distance from the plane including the lower surface of the cell 80a illustrated in FIG. 12 to the tip end of the conductive connection portion 83. The depth of the opening 824 means a distance from the plane including the upper surface of the insulating film 823 illustrated in FIG. 12 to the bottom surface of the opening 824.

On the other hand, in a case where the conductive connection portion 83 is disposed so as to be in contact with the opening 824 of the wiring substrate 82, as illustrated in FIG. 13, the shape of the conductive connection portion 83 is preferably formed into a shape protruding upward, that is, a shape protruding toward the cell 80a side in the lamination step which will be described later. The conductive connection portion 83 is brought into contact with the electrode pad 86 of the cell 80a with a high probability in the lamination step, which will be described later, by being formed into such a shape. With this configuration, it is possible to securely establish electrical connection between the electrode pad 86 of the cell 80a and the opening 824 of the wiring substrate 82 through the conductive connection portion 83.

The protrusion height of the conductive connection portion 83 illustrated in FIG. 13 is not particularly limited as long as it protrudes from a plane including the upper surface of the wiring substrate 82. In other words, in a case where the conductive connection portion 83 is disposed so as to protrude from the bottom surface of the opening 824, the protrusion height of the conductive connection portion 83 is preferably higher than the depth of the opening 824. With this configuration, in the lamination step which will be described later, it is possible to more securely connect the opening 824 of the wiring substrate 82 and the electrode pad 86 of the cell 80a by the conductive connection portion 83.

The protrusion height of the conductive connection portion 83 illustrated in FIG. 13 is preferably set to 101% or more and 1000% or less of the depth of the opening 824, more preferably 110% or more and 750% or less, further more preferably 120% or more and 500% or less. With this configuration, it is possible to more reliably connect the electrode pad 86 of the cell 80a and the opening 824 of the wiring substrate 82 by the conductive connection portion 83.

The "protrusion height of the conductive connection portion 83" means a distance from the plane including the upper surface of the insulating film 823 illustrated in FIG. 13 to the tip end of the conductive connection portion 83. The depth of the opening 824 means a distance from the plane including the upper surface of the insulating film 823 illustrated in FIG. 13 to the bottom surface of the opening 824.

A shape of the opening 824 in a plan view is not particularly limited, but is, for example, a shape having a long axis along the longitudinal direction of the insulating substrate 821. With this configuration, since a positional displacement of the conductive connection portion 83 within the opening 824 is allowed to some extent, when the cell 80a is connected, the conductive connection portion 83 is allowed to move to some extent according to the position of the electrode pads 86 and 87 of the cell 80a. As a result, it is possible to suppress the residual stress due to the connection in the cell 80a. Accordingly, a more reliable solar cell 80 can be realized.

The conductive film 822 exposed from the opening 824 functions as a so-called land portion. That is, as illustrated in FIG. 7, the wiring substrate 82 includes the insulating substrate 821, the conductive film 822 (conductive layer) provided on the insulating substrate 821, and the opening 824 in which a plurality of land portions electrically connected to the conductive film 822 are exposed. The disposition of the opening 824 (disposition of the land portions) corresponds to the disposition of the first terminal 861, the second terminal 872, the third terminal 863, the fourth terminal 874, and the fifth terminal 865 illustrated in FIG. 11.

By allowing the disposition of the opening 824 to be set as described above, it is possible to reduce occurrence of extra exposed portions of the first terminal 861, the second terminal 872, the third terminal 863, the fourth terminal 874, and the fifth terminal 865 or the land portion after the cell 80a and the wiring substrate 82 are joined together via the conductive connection portion 83. As a result, for example, when mounting the solar cell 80, a risk of electrical failure such as short-circuiting due to unintended contact can be suppressed, and reliability of the solar cell 80 can be further enhanced.

[3] Next, as illustrated in FIG. 12 or 13, the cell 80a and the wiring substrate 82 are laminated (lamination process) through the conductive connection portion 83.

Specifically, after the cell 80a and the wiring substrate 82 are laminated, the cell 80a and the wiring substrate 82 are brought close to each other until the cell 80a and the insulating film 823 are in contact with each other. Along with this, the conductive connection portion 83 is heated and melted or softened. With this configuration, the conductive connection portion 83 receives the load and deforms and spreads inside the opening 824. As a result, the conductive connection portion 83 can contact both the electrode pad 86 of the cell 80*a* and the conductive film 822 of the wiring substrate 82 to electrically and mechanically connect both the electrode pad 86 and the conductive film 822.

The cell 80*a* and the wiring substrate 82 may be further connected through a member other than the conductive connection portion 83, but a structure in which the cell 80*a* and the wiring substrate 82 are connected through only the conductive connection portion 83 is preferable. With this configuration, the connection work is facilitated, so that manufacturing cost of the solar cell 80 can be reduced.

As described above, when the volume of the conductive connection portion 83 is equal to or less than the volume of the opening 824, even if the conductive connection portion 83 is deformed, the conductive connection portion 83 is accommodated inside the opening 824. For that reason, it is possible to prevent the conductive connection portion 83 from overflowing from the opening 824. With this configuration, it is possible to prevent the overflowed conductive connection portion 83 from causing short-circuiting or from becoming defective in appearance.

Furthermore, when the conductive connection portion 83 overflows from the opening 824, the overflowed conductive connection portion 83 is interposed between the cell 80*a* and the insulating film 823. For that reason, there is a concern that the distance between the cell 80*a* and the insulating film 823 changes or the cell 80*a* is inclined depending on the amount of the overflowed conductive connection portion 83. Such concern influences dimensional accuracy of the solar cell 80 and thus, for example, when the solar cell 80 is stored in the internal space 36 of the device main body 30, inconvenience is caused.

Accordingly, it is possible to secure flatness of the cell 80*a*, for example, by preventing the conductive connection portion 83 from overflowing. As a result, it is possible to prevent defects from occurring in dimensional accuracy of the solar cell 80 or prevent appearance of the solar cell 80 from being deteriorated.

When the length in the longitudinal direction of the opening 824 is set as L1 (see FIG. 5), the distance L2 between the openings 824 (see FIG. 5) is preferably set to 1% or more and 500% or less of the length L1, more preferably 10% or more and 400% or less, furthermore preferably 100% or more and 300% or less. By setting the separation distance L2 between the openings 824 within the range described above, it is possible to provide a plurality of openings 824 while reducing the probability that the conductive connection portion 83 overflowed from the opening 824 reaches the adjacent opening 824, thereby improving mechanical and electrical reliability thereof.

The distance L2 between the openings 824 means the shortest distance between the opening 824 and the opening 824 which is closest to one opening 824 in a plan view.

At the periphery of the opening 824, the insulating film 823 is swelled by a thickness of the conductive film 822. For that reason, in this lamination step, when the swelled portion is in contact with the cell 80*a*, the other portion is separated from the cell 80*a*.

In other words, since the conductive connection portion 83 does not overflow from the opening 824, a part (swelled portion) of the insulating film 823 comes into contact with the cell 80*a* and the other portion (part different from the swelled portion) is separated from the cell 80*a*.

According to such a configuration, the wiring substrate 82 and the cell 80*a* come into contact with each other at the swelled portion, so that it is possible to accurately regulate the distance between the wiring substrate 82 and the cell 80*a*. With this configuration, it is possible to further enhance the flatness and dimensional accuracy of the solar cell 80. On the other hand, due to the presence of portions which are not in contact, stress hardly occurs between the wiring substrate 82 and the cell 80*a*. That is, even in a case where the thermal expansion coefficients of between the wiring substrate 82 and the cell 80*a* are different from each other, occurrence of stress can be suppressed by deviating the portions which are not in contact.

Since a part of the insulating film 823 is separated from the cell 80*a*, the possibility of foreign substance being caught between the insulating film 823 and the cell 80*a* is reduced. With this configuration, it is possible to avoid breakage of the cell 80*a* due to the foreign substance being caught.

The expression of the portions not in contact with each other means that the portions that do not necessarily need to be separated from each other, and that are in a state where the portions may be in contact with each other but readily deviate in response to stress or the like. For example, when the wiring substrate 82 has flexibility, the wiring substrate 82 may be in a state of following the cell 80*a* due to its flexibility.

The thickness of the conductive film 822 is preferably 1 μm or more and 150 μm or less, and more preferably 3 μm or more and 100 μm or less. With this configuration, the protrusion height of the swelled portion is optimized, so that it is possible to achieve both of the dimensional accuracy of the solar cell 80 and the conductivity of the conductive film 822.

That is, when the thickness of the conductive film 822 is less than the lower limit value, there is a concern that the conductivity of the conductive film 822 may decrease. On the other hand, when the thickness of the conductive film 822 exceeds the upper limit value, since the protrusion height of the swelled portion becomes too high, there is a concern that adhesion between the wiring substrate 82 and the cell 80*a* becomes unstable and the dimensional accuracy decreases.

Thus, the solar cell 80 is obtained.

Although the invention has been described as above based on the illustrated embodiments, the invention is not limited thereto.

For example, the photoelectric conversion element, the photoelectric conversion module, and the electronic device according to the invention may be those in which a part of the elements of the embodiments described above is replaced by any elements having equivalent functions, and any element may be added to the embodiments.

The entire disclosure of Japanese Patent Application No. 2018-030522, filed Feb. 23, 2018 is expressly incorporated by reference herein.

What is claimed is:

1. A photoelectric conversion element comprising:
   a semiconductor substrate which has a substrate outer edge including a circular arc; and
   a first terminal, a second terminal, a third terminal, and a fourth terminal disposed in this order in a staggered arrangement along a circumferential direction of the circular arc on one surface side of the semiconductor substrate, such that
   a distance from the substrate outer edge to the second terminal and a distance from the substrate outer edge to the fourth terminal are greater than a distance from the substrate outer edge to the first terminal and a distance from the substrate outer edge to the third terminal.

2. The photoelectric conversion element according to claim 1, wherein
the semiconductor substrate has the substrate outer edge and a substrate inner edge positioned inside the substrate outer edge and including a curved line,
the first terminal and the third terminal are positioned close to a substrate outer edge side from an intermediate line between the substrate outer edge and the substrate inner edge, and
the second terminal and the fourth terminal are positioned close to a substrate inner edge side from the intermediate line.

3. The photoelectric conversion element according to claim 2, further comprising:
five or more terminals including the first terminal, the second terminal, the third terminal, and the fourth terminal,
wherein the number of the terminals positioned close to the substrate outer edge side from the intermediate line is greater than the number of the terminals positioned close to the substrate inner edge side from the intermediate line.

4. The photoelectric conversion element according to claim 2,
wherein the substrate outer edge and the substrate inner edge each include a circular arc, the circular arcs being concentric with each other.

5. The photoelectric conversion element according to claim 1,
wherein the semiconductor substrate has single crystallinity.

6. A photoelectric conversion module comprising:
the photoelectric conversion element according to claim 1; and
a wiring substrate provided so as to overlap the photoelectric conversion element.

7. A photoelectric conversion module comprising:
the photoelectric conversion element according to claim 2; and
a wiring substrate provided so as to overlap the photoelectric conversion element.

8. A photoelectric conversion module comprising:
the photoelectric conversion element according to claim 3; and
a wiring substrate provided so as to overlap the photoelectric conversion element.

9. A photoelectric conversion module comprising:
the photoelectric conversion element according to claim 4; and
a wiring substrate provided so as to overlap the photoelectric conversion element.

10. A photoelectric conversion module comprising:
the photoelectric conversion element according to claim 5; and
a wiring substrate provided so as to overlap the photoelectric conversion element.

11. The photoelectric conversion module according to claim 6, wherein
the wiring substrate includes an insulating substrate, a conductive layer provided on the insulating substrate, and a plurality of land portions electrically connected to the conductive layer, and
disposition of the land portions corresponds to the disposition of the first terminal, the third terminal, the second terminal, and the fourth terminal.

12. An electronic device comprising:
the photoelectric conversion element according to claim 1.

13. An electronic device comprising:
the photoelectric conversion element according to claim 2.

14. An electronic device comprising:
the photoelectric conversion element according to claim 3.

15. An electronic device comprising:
the photoelectric conversion element according to claim 4.

16. An electronic device comprising:
the photoelectric conversion element according to claim 5.

* * * * *